(12) United States Patent
Yun et al.

(10) Patent No.: US 12,279,387 B2
(45) Date of Patent: Apr. 15, 2025

(54) HINGE ASSEMBLY AND ELECTRONIC DEVICE INCLUDING THE SAME

(71) Applicant: SAMSUNG ELECTRONICS CO., LTD., Suwon-si (KR)

(72) Inventors: Sukjin Yun, Suwon-si (KR); Donghyun Byun, Suwon-si (KR); Chongkun Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 203 days.

(21) Appl. No.: 17/893,853

(22) Filed: Aug. 23, 2022

(65) Prior Publication Data

US 2023/0076291 A1    Mar. 9, 2023

Related U.S. Application Data

(63) Continuation of application No. PCT/KR2022/010627, filed on Jul. 20, 2022.

(30) Foreign Application Priority Data

Sep. 7, 2021    (KR) .................. 10-2021-0118927

(51) Int. Cl.
*H05K 5/02* (2006.01)
*F16C 11/04* (2006.01)

(52) U.S. Cl.
CPC ............ *H05K 5/0226* (2013.01); *F16C 11/04* (2013.01)

(58) Field of Classification Search
CPC .................................................. H05K 7/00
See application file for complete search history.

(56) References Cited

U.S. PATENT DOCUMENTS 5,600,868 A  *  2/1997   Tourville ............... E05F 1/1223
                                                      16/280
2021/0181808 A1*  6/2021   Liao ...................... G06F 1/1652

FOREIGN PATENT DOCUMENTS

| CN | 111131567 | 5/2020 |
|---|---|---|
| CN | 113225412 | 8/2021 |
| JP | 2014-062644 | 4/2014 |
| KR | 10-2019-0065641 | 6/2019 |
| KR | 10-2020-0126524 | 11/2020 |
| KR | 10-2020-0135636 | 12/2020 |
| KR | 10-2020-0137896 | 12/2020 |

(Continued)

OTHER PUBLICATIONS

Search Report dated Oct. 14, 2022 in counterpart International Patent Application No. PCT/KR2022/010627.

*Primary Examiner* — Jerry Wu
(74) *Attorney, Agent, or Firm* — Nixon & Vanderhye, P.C.

(57) ABSTRACT

In an example embodiment, an electronic device may include a display, a first housing; a second housing, and a hinge assembly, wherein the hinge assembly may include a bracket structure, a pair of rotator structures respectively rotatable on a pair of hinge axes, a pair of arms respectively rotatable on a pair of arm axes, and each including an arm cam and a penetrating rail, a pair of pins respectively passing through the penetrating rails, connected to the rotator structure, respectively rotatable on a pair of pin axes, and each including a pin cam interoperating with the arm cam and a sliding guide slidable along the penetrating rail, and a pair of elastic members respectively connected to the pair of pins and each configured to press the pin cam toward the arm cam.

19 Claims, 25 Drawing Sheets

(56) References Cited

FOREIGN PATENT DOCUMENTS

| KR | 10-2244807 | 4/2021 |
| KR | 10-2021-0054954 | 5/2021 |
| KR | 10-2021-0101717 | 8/2021 |
| KR | 10-2284053 | 8/2021 |

* cited by examiner

HINGE ASSEMBLY AND ELECTRONIC DEVICE INCLUDING THE SAME

CROSS-REFERENCE TO RELATED APPLICATIONS

This application is a continuation of International Application No. PCT/KR2022/010627 designating the United States, filed on Jul. 20, 2022, in the Korean Intellectual Property Receiving Office and claiming priority to Korean Patent Application No. 10-2021-0118927, filed on Sep. 7, 2021, in the Korean Intellectual Property Office, the disclosures of which are incorporated by reference herein in their entireties.

BACKGROUND

1. Field

The disclosure relates to a hinge assembly and an electronic device including the hinge assembly.

2. Description of Related Art

With the development of display-related technologies, electronic devices with flexible displays have been developed. A flexible display may be used in the form of a flat surface, and may also be deformed to be used in a specific shape. For example, an electronic device with a flexible display may be implemented in a foldable form to be folded or unfolded about at least one folding axis.

SUMMARY

To implement a folding operation or unfolding operation of an electronic device, a hinge assembly may be provided between a first housing and a second housing. The hinge assembly may have a structure for generating a force to maintain a predetermined folding state of the electronic device. The structure described above may be implemented using a cam structure and an elastic member. However, as the thickness of the electronic device decreases, the diameter of the elastic member may also decrease and this may cause a decrease in the elastic force of the elastic member. Accordingly, a method of reducing the thickness of the hinge assembly by providing the cam structure and the elastic member on the outer side of a hinge bracket may be considered.

According to various example embodiments, a hinge assembly including a cam structure and an elastic member provided on the outer side of a hinge bracket and an electronic device including the hinge assembly may be provided.

According to various example embodiments, a hinge assembly for reducing uneven wear that may occur while a pin slides along a penetrating rail and an electronic device including the hinge assembly may be provided.

According to various example embodiments, a hinge assembly for reducing a driving sound due to a gap between components during folding or unfolding operations and an electronic device including the hinge assembly may be provided.

In an example embodiment, an electronic device may include a display including a first area, a second area, and a folding area between the first area and the second area; a first housing configured to support the first area; a second housing configured to support the second area; and a hinge assembly configured to connect the first housing to the second housing and operate between a folded state in which the first area and the second area face each other and an unfolded state in which the first area and the second area do not face each other, wherein the hinge assembly may include a bracket structure; a pair of rotator structures connected to the bracket structure and respectively rotatable on a pair of hinge axes; a pair of arms connected to the bracket structure, respectively rotatable on a pair of arm axes, and each including an arm cam and a penetrating rail having a longitudinal direction perpendicular to the arm axis of the arm; a pair of pins respectively passing through the penetrating rails, connected to the rotator structure, respectively rotatable on a pair of pin axes, and each including a pin cam interoperating with the arm cam and a sliding guide slidable along the penetrating rail; and a pair of elastic members respectively connected to the pair of pins and each configured to press the pin cam toward the arm cam, and wherein, when the rotator structure rotates on the hinge axis, the arm rotates on the arm axis, and the pin rotates on the pin axis while the pin slides along the penetrating rail with respect to the arm.

A hinge assembly applied to a foldable electronic device, the hinge assembly may include a bracket structure; a pair of rotator structures connected to the bracket structure and respectively rotatable on a pair of hinge axes; a pair of arms connected to the bracket structure, respectively rotatable on a pair of arm axis, and each including an arm cam and a penetrating rail having a longitudinal direction perpendicular to the arm axis; a pair of pins respectively passing through the penetrating rails, connected to the rotator structure, respectively rotatable on a pair of pin axes, and each including a pin cam interoperating with the arm cam and a sliding guide slidable along the penetrating rail; and a pair of elastic members respectively connected to the pair of pins and each configured to press the pin cam toward the arm cam, and wherein, when the rotator structure rotates on the hinge axis, the arm rotates on the arm axis, and the pin rotates on the pin axis while the pin slides along the penetrating rail with respect to the arm.

An electronic device may include a display including a first area, a second area, and a folding area between the first area and the second area; a first housing configured to support the first area; a second housing configured to support the second area; and a hinge assembly configured to connect the first housing to the second housing and operate between a folded state in which the first area and the second area face each other and an unfolded state in which the first area and the second area do not face each other, wherein the hinge assembly may include a bracket structure; a pair of rotator structures connected to the bracket structure and respectively rotatable on a pair of hinge axes; a pair of arms connected to the bracket structure, respectively rotatable on a pair of arm axes, and each including an arm cam and a penetrating rail having a longitudinal direction perpendicular to the arm axis; a pair of pins respectively passing through the penetrating rails, connected to the rotator structure, respectively rotatable on a pair of pin axes, and each including a pin cam interoperating with the arm cam and a sliding guide slidable along the penetrating rail; and a pair of elastic members respectively connected to the pair of pins and each configured to press the pin cam toward the arm cam, wherein the bracket structure may include a main bracket; a first bracket fixedly connected to the main bracket and including a pair of rotation rails respectively defining the pair of hinge axes; and a second bracket slidably connected to the main bracket and including a pair of helical rails with the pair of hinge axes as centers, respectively, wherein each of the rotator structures may include a first rotator connected to the rotation rail of the first bracket; a second rotator connected to the helical rail of the second bracket; and a bridge configured to connect the first rotator to the second rotator, wherein the arm is between the first rotator and the second rotator, and when the rotator structure rotates on the hinge axis, the arm rotates on the arm axis, and the pin rotates on the pin axis while sliding along the penetrating rail with respect to the arm such that the sliding guide is parallel with the penetrating rail.

According to various example embodiments, the thickness of the hinge assembly may decrease by providing the cam structure and the elastic member on the outer side of the hinge bracket.

According to various example embodiments, uneven wear may decrease as the pin rotates such that the pin cam is parallel with the arm cam while the pin slides along the penetrating rail of the arm.

According to various example embodiments, by pressing the pin and/or an arm rotating part in a direction perpendicular to an axis, a driving sound during folding or unfolding operations may decrease.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIG. 4O illustrates overlapping side views is a view illustrating by overlapping side views of an unfolded state, an intermediate state, and a folded state of the hinge assembly according to an example embodiment;

DETAILED DESCRIPTION

Figure 1:
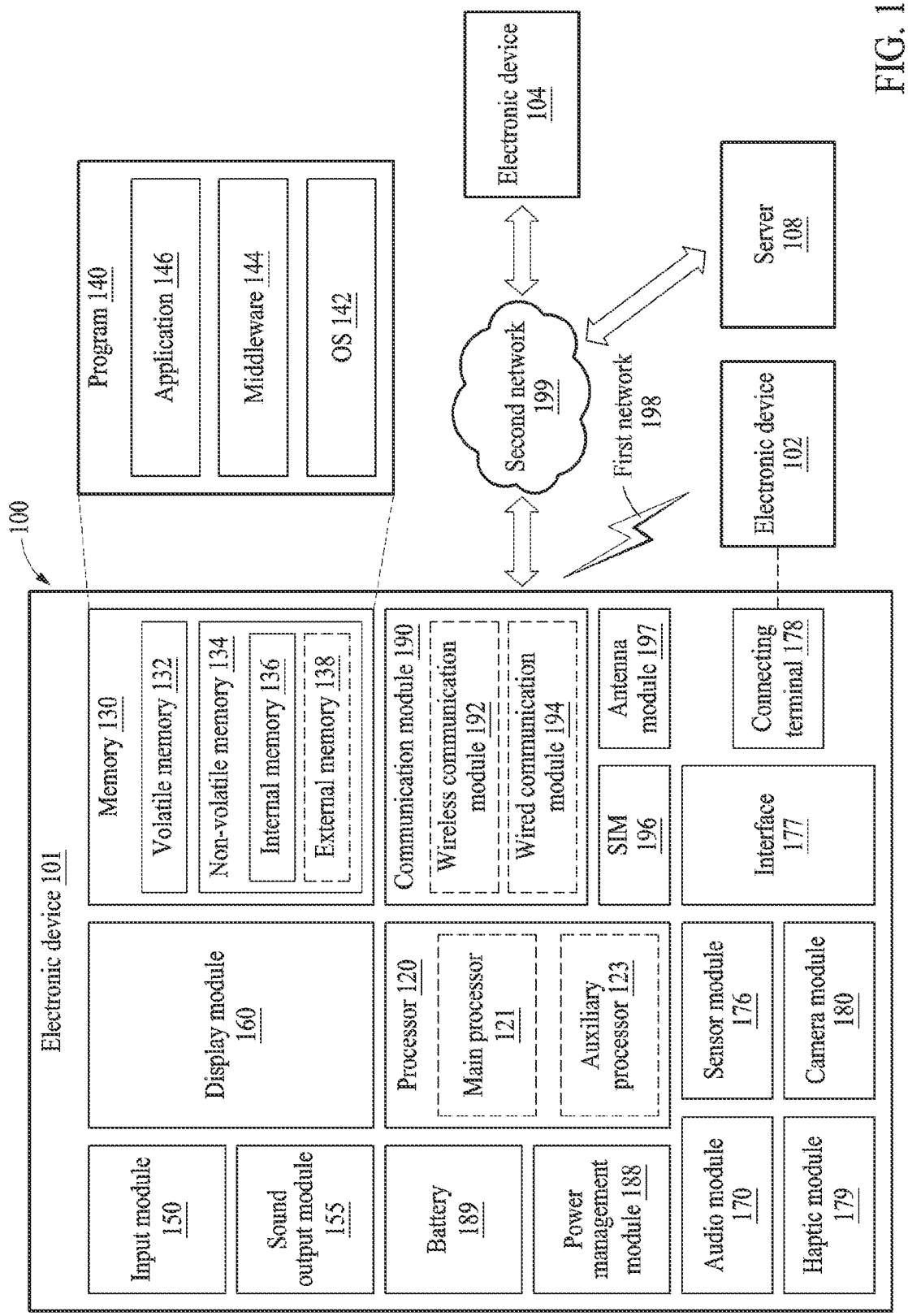
FIG. 1 is a block diagram of an electronic device in a network environment according to various example embodiments.

Hereinafter, example embodiments will be described in detail with reference to the accompanying drawings. When describing the example embodiments with reference to the accompanying drawings, like reference numerals refer to like elements and a repeated description related thereto will be omitted.

FIG. 1 is a block diagram illustrating an electronic device 101 in a network environment 100 according to various example embodiments.

Referring to FIG. 1, the electronic device 101 in the network environment 100 may communicate with an electronic device 102 via a first network 198 (e.g., a short-range wireless communication network), or communicate with an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In an example embodiment, at least one (e.g., the connecting terminal 178) of the above components may be omitted from the electronic device 101, or one or more other components may be added in the electronic device 101. In an example embodiment, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An artificial intelligence model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display device 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input device 150 or output the sound via the sound output device 155 or an external electronic device (e.g., an electronic device 102 such as a speaker or a headphone) directly (e.g., by a wired connection) or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196. The subscriber identification module 196 may include a plurality of subscriber identification modules. For example, the plurality of subscriber identification modules may store different subscriber information.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band. For example, the plurality of antennas may include a patch array antenna and/or a dipole array antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
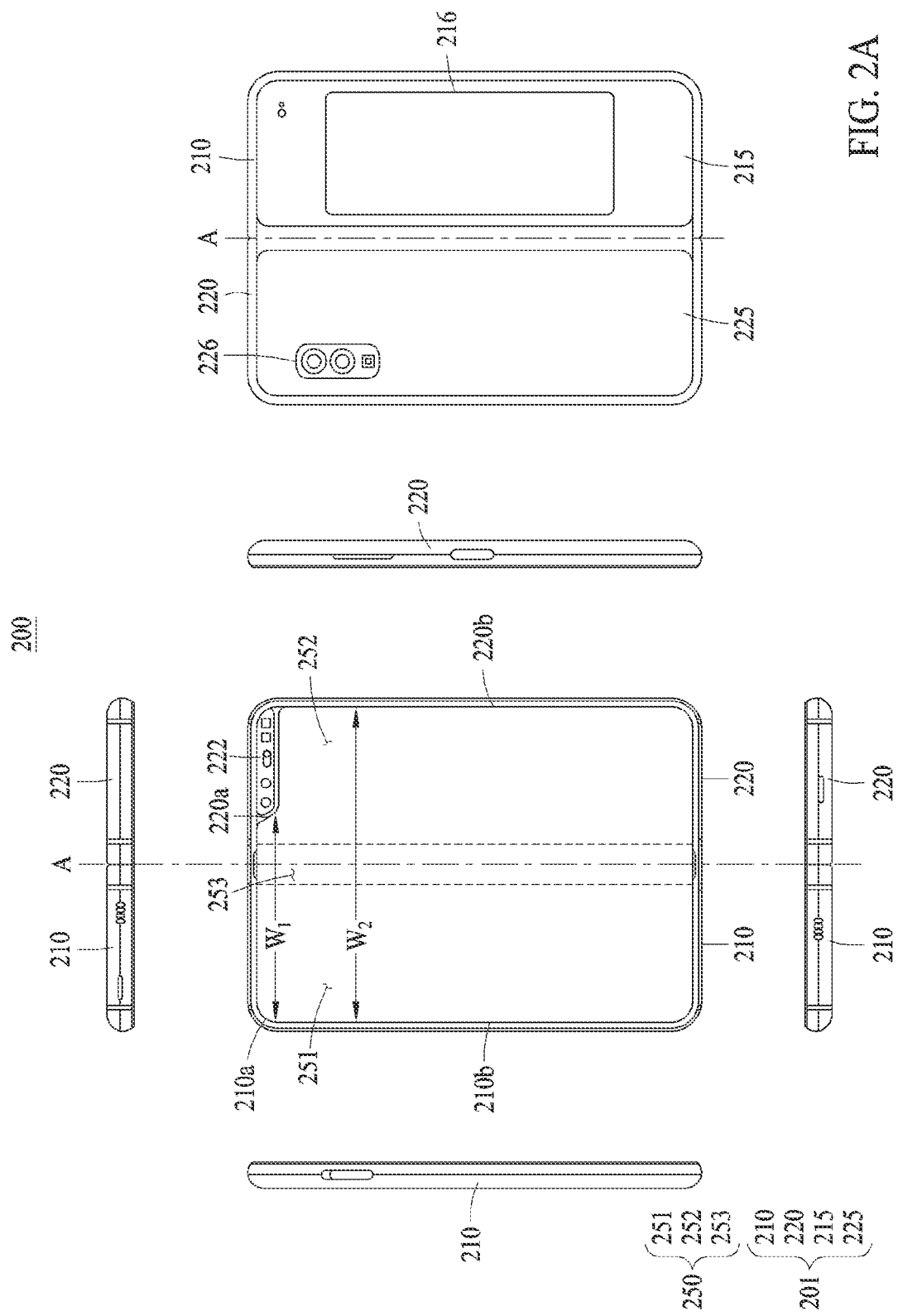
FIG. 2A is a diagram illustrating an unfolded state of the electronic device according to various example embodiments.
Figure 2B:
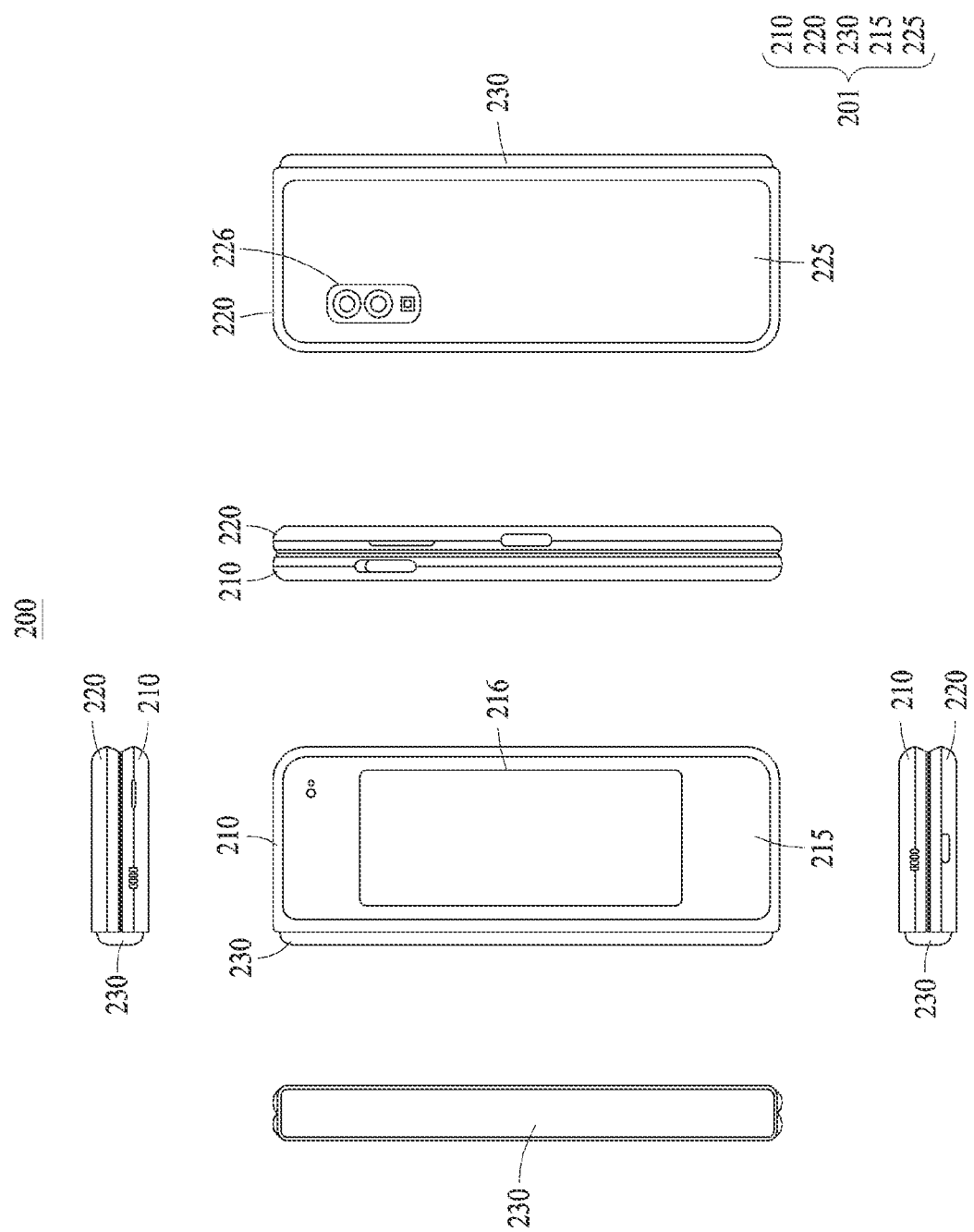
FIG. 2B is a diagram illustrating a folded state of the electronic device according to various example embodiments.
Figure 2C:
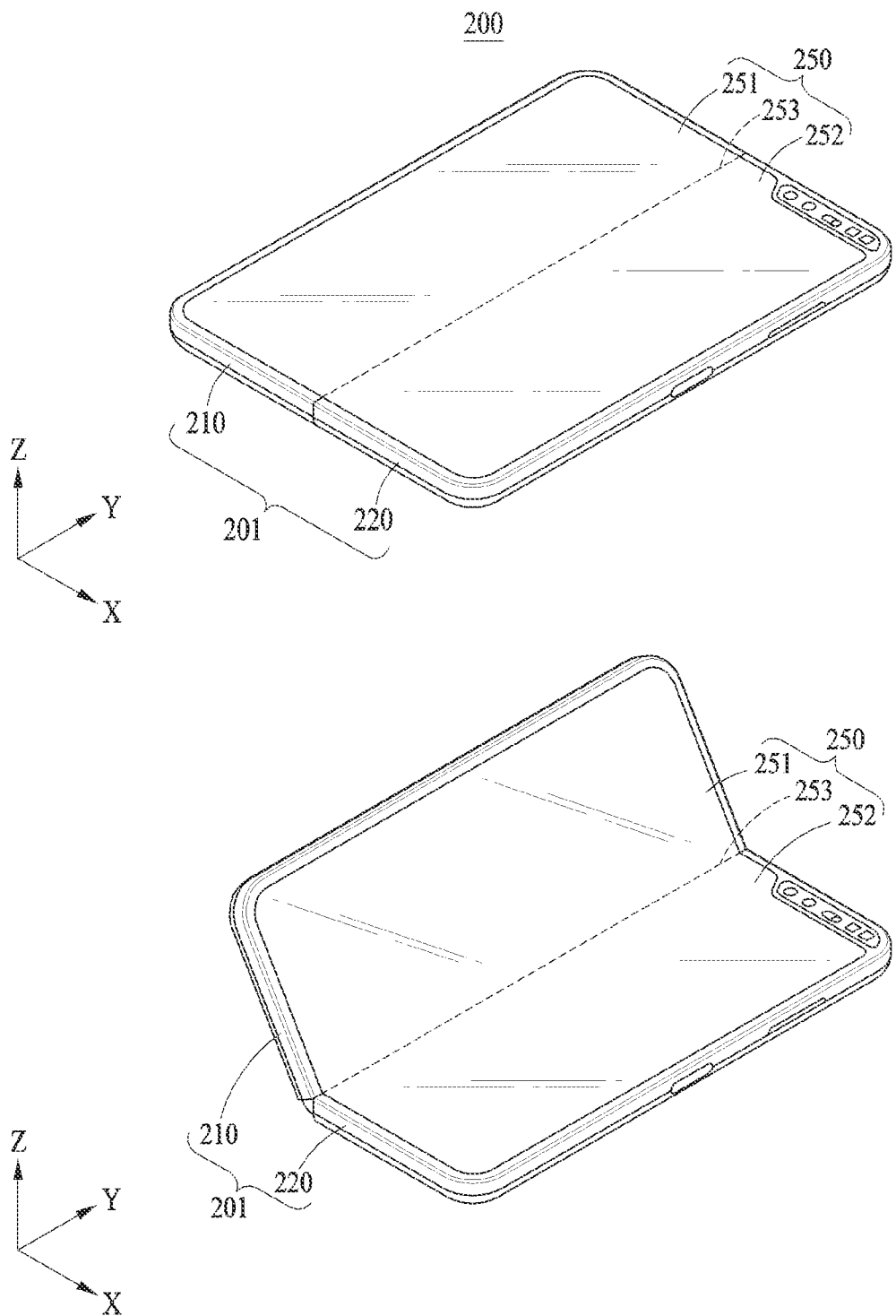
FIG. 2C is a perspective view illustrating an example of a fully unfolded state or an intermediate state of the electronic device according to various example embodiments.

FIG. 2A is a diagram illustrating an unfolded state of an electronic device 200 according to various example embodiments. FIG. 2B is a diagram illustrating a folded state of the electronic device 200 according to various example embodiments. FIG. 2C is a perspective view illustrating an example of a fully unfolded state or an intermediate state of the electronic device 200 according to various example embodiments;

The electronic device 200 of FIGS. 2A, 2B, and 2C is an example of the electronic device 101 of FIG. 1 and may be a foldable or bendable electronic device.

In FIG. 2C and other following drawings, illustrated is a spatial coordinate system defined by an X axis, a Y axis, and a Z axis that are orthogonal to each other. Here, the X-axis may represent a width direction of an electronic device, the Y-axis may represent a length direction of the electronic device, and the Z-axis may represent a height (or thickness) direction of the electronic device. In the following description, a "first direction" may refer to a direction parallel to the Z-axis.

Referring to FIGS. 2A and 2B, in an example embodiment, the electronic device 200 may include a foldable housing 201 and a flexible or foldable display 250 (hereinafter, the "display" 250 for short) (e.g., the display module 160 of FIG. 1) disposed in a space formed by the foldable housing 201. A surface on which the display 250 is disposed (or a surface on which the display 250 is viewed from the outside of the electronic device 200) may be defined as a front surface of the electronic device 200. In addition, a surface opposite to the front surface may be defined as a rear surface of the electronic device 200. Further, a surface surrounding a space between the front surface and the rear surface may be defined as a side surface of the electronic device 200.

According to various example embodiments, the foldable housing 201 may include a first housing structure 210, a second housing structure 220 including a sensor area 222, a first rear cover 215, a second rear cover 225, and a hinge structure discussed in greater detail below. Here, the hinge structure may include a hinge cover 230 that covers a foldable portion of the foldable housing 201. The foldable housing 201 of the electronic device 200 is not limited to the shape and combination shown in FIGS. 2A and 2B, and may be implemented in a different shape or using a different combination of components. For example, in an example embodiment, the first housing structure 210 and the first rear cover 215 may be integrally formed, and the second housing structure 220 and the second rear cover 225 may be integrally formed.

According to various example embodiments, the first housing structure 210 may be connected to the hinge structure and may include a first surface facing a first direction and a second surface facing a second direction opposite to the first direction. The second housing structure 220 may be connected to the hinge structure and may include a third surface facing a third direction and a fourth surface facing a fourth direction opposite to the third direction. The second housing structure 220 may rotate with respect to the first housing structure 210 about the hinge structure. A state of the electronic device 200 may be changed to a folded state or an unfolded state.

According to an example embodiment, the first surface may face the third surface in a state in which the electronic device 200 is fully folded and the third direction may be identical to the first direction in a state in which the electronic device 200 is fully unfolded.

According to various example embodiments, the first housing structure 210 and the second housing structure 220 are disposed on both sides with respect to a folding axis A and generally may be symmetrical with respect to the folding axis A. As will be described hereinafter, an angle or distance between the first housing structure 210 and the second housing structure 220 may vary depending on whether the state of the electronic device 200 is the unfolded state, the folded state, or a partially unfolded or folded state (or an intermediate state). According to an example embodiment, unlike the first housing structure 210, the second housing structure 220 may additionally include the sensor area 222, in which various sensors are arranged, however, the first housing structure 210 and the second housing structure 220 may have shapes symmetrical to each other in areas other than the sensor area 222.

According to various example embodiments, as shown in FIG. 2A, the first housing structure 210 and the second housing structure 220 may together form a recess for accommodating the display 250. In an example embodiment, due to the sensor area 222, the recess may have at least two different widths in a direction perpendicular to the folding axis A. For example, the recess may have a first width $W_1$ between a first portion 210a of the first housing structure 210 parallel to the folding axis A and a first portion 220a of the second housing structure 220 formed on a periphery of the sensor area 222, and a second width $W_2$ formed by a second portion 210b of the first housing structure 210 and a second portion 220b of the second housing structure 220 not corresponding to the sensor area 222 and being parallel to the folding axis A. In this case, the second width $W_2$ may be greater than the first width $W_1$. In an example embodiment, the first portion 220a and the second portion 220b of the second housing structure 220 may be at different distances from the folding axis A. The widths of the recess are not limited to the shown example. In an example embodiment, the recess may have a plurality of widths according to the shape of the sensor area 222 or asymmetrical portions of the first housing structure 210 and the second housing structure 220. According to various example embodiments, the sensor area 222 may be formed to have a predetermined area adjacent to one corner of the second housing structure 220. However, the arrangement, shape, and size of the sensor area 222 are not limited to the shown example. For example, in an example embodiment, the sensor area 222 may be provided at another corner of the second housing structure 220 or in a predetermined area between an upper corner and a lower corner. In an example embodiment, components embedded in the electronic device 200 to perform various functions may be visually exposed to the front surface of the electronic device 200 through the sensor area 222 or through one or more openings provided in the sensor area 222. In various example embodiments, the components may include various types of sensors. The sensors may include, for example, at least one of a front camera, a receiver, or a proximity sensor. According to various example embodiments, the sensor area 222 may not be included in the second housing structure 220 or may be formed at a position different from that shown in the drawings.

According to various example embodiments, at least a portion of the first housing structure 210 and the second housing structure 220 may be formed of a metal material or a non-metal material having a selected magnitude of rigidity to support the display 250. At least a portion formed of the metal material may provide a ground plane for the electronic device 200, and may be electrically connected to a ground line formed on a printed circuit board (PCB) disposed inside the foldable housing 201.

According to various example embodiments, the first rear cover 215 may be disposed on one side of the folding axis A on a rear surface of the electronic device 200, and may have, for example, a substantially rectangular periphery that may be surrounded by the first housing structure 210. Similarly, the second rear cover 225 may be disposed on the other side of the folding axis A on the rear surface of the electronic device 200, and may have a periphery that may be surrounded by the second housing structure 220.

According to various example embodiments, the first rear cover 215 and the second rear cover 225 may be substantially symmetrical with respect to the folding axis A. However, the first rear cover 215 and the second rear cover 225 are not necessarily mutually symmetrical. In another example, the electronic device 200 may include a first rear cover 215 and a second rear cover 225 in various shapes. In an example embodiment, the first rear cover 215 may be formed integrally with the first housing structure 210, and the second rear cover 225 may be formed integrally with the second housing structure 220.

According to various example embodiments, the first rear cover 215, the second rear cover 225, the first housing structure 210, and the second housing structure 220 may form a space in which various components (e.g., a PCB, or a battery) of the electronic device 200 are to be disposed. In an example embodiment, one or more components may be disposed or visually exposed on the rear surface of the electronic device 200. For example, at least a portion of a sub-display may be visually exposed through a first rear area 216 of the first rear cover 215. In another example embodiment, one or more components or sensors may be visually exposed through a second rear area 226 of the second rear cover 225. In various example embodiments, the sensors may include a proximity sensor and/or a rear camera.

According to various example embodiments, a front camera visually exposed to the front surface of the electronic device 200 through one or more openings provided in the sensor area 222, or a rear camera visually exposed through the second rear area 226 of the second rear cover 225 may include one or more lenses, an image sensor, and/or an image signal processor. A flash may include, for example, a light-emitting diode (LED) or a xenon lamp. In some example embodiments, two or more lenses (e.g., infrared camera, wide-angle, and telephoto lenses) and image sensors may be disposed on one surface of the electronic device 200.

Referring to FIG. 2B, the hinge cover 230 may be disposed between the first housing structure 210 and the second housing structure 220 to cover internal components (e.g., the hinge structure). According to an example embodiment, the hinge cover 230 may be covered by a portion of the first housing structure 210 and a portion of the second housing structure 220, or may be exposed to the outside, depending on the state (e.g., the unfolded state, the intermediate state, or the folded state) of the electronic device 200.

For example, when the electronic device 200 is in the unfolded state (e.g., the fully unfolded state) as illustrated in FIG. 2A, the hinge cover 230 may be covered by the first housing structure 210 and the second housing structure 220 so as not to be exposed. In another example, when the electronic device 200 is in the folded state (e.g., a fully folded state), as shown in FIG. 2B, the hinge cover 230 may be exposed to the outside between the first housing structure 210 and the second housing structure 220. In another example, when the first housing structure 210 and the second housing structure 220 are in an intermediate state in which the first housing structure 210 and the second housing structure 220 are folded with a certain angle therebetween, a portion of the hinge cover 230 may be partially exposed to the outside between the first housing structure 210 and the second housing structure 220. However, the area exposed in this example may be smaller than that in the fully folded state. In an example embodiment, the hinge cover 230 may include a curved surface.

According to various example embodiments, the display 250 may be disposed in a space formed by the foldable housing 201. For example, the display 250 may be seated in the recess formed by the foldable housing 201 and may be viewed from the outside through the front surface of the electronic device 200. For example, the display 250 may include most of the front surface of the electronic device 200. Accordingly, the front surface of the electronic device 200 may include the display 250, and a partial area of the first housing structure 210 and a partial area of the second housing structure 220, which are adjacent to the display 250. In addition, the rear surface of the electronic device 200 may include the first rear cover 215, a partial area of the first housing structure 210 adjacent to the first rear cover 215, the second rear cover 225, and a partial area of the second housing structure 220 adjacent to the second rear cover 225.

According to various example embodiments, the display 250 may refer to a display in which at least one area is deformable into a planar surface or a curved surface. In an example embodiment, the display 250 may include a folding area 253, a first area 251 disposed on one side of the folding area 253 (e.g., on the left side of the folding area 253 shown in FIG. 2A), and a second area 252 disposed on the other side of the folding area 253 (e.g., on the right side of the folding area 253 shown in FIG. 2A).

However, the areas into which the display 250 is divided in FIG. 2A is merely an example, and the display 250 may be divided into a plurality of areas (e.g., four or more areas, or two areas) depending on the structure or functions thereof. In an example, as shown in FIG. 2A, the display 250 may be divided into areas based on the folding area 253 extending parallel to the folding axis A. In another example, the display 250 may be divided into areas based on another folding axis (e.g., a folding axis parallel to a width direction of an electronic device).

According to various example embodiments, the display 250 may be coupled to or disposed adjacent to a touch panel in which a touch sensing circuit and a pressure sensor configured to measure an intensity (or pressure) of a touch are provided. For example, the display 250 is an example of a touch panel, and may be coupled to or disposed adjacent to a touch panel for detecting an electromagnetic resonance (EMR) type stylus pen.

According to various example embodiments, the first area 251 and the second area 252 may generally have symmetrical shapes with respect to the folding area 253. However, unlike the first area 251, the second area 252 may include a notch cut according to the presence of the sensor area 222, but may be symmetrical to the first area 251 in the other areas. In other words, the first area 251 and the second area 252 may include mutually symmetrical portions and mutually asymmetrical portions.

According to various example embodiments, an edge thickness of each of the first area 251 and the second area 252 may be different from an edge thickness of the folding area 253. The edge thickness of the folding area 253 may be less than those of the first area 251 and the second area 252. For example, the first area 251 and the second area 252 may be asymmetrical in terms of thickness when cross-sectionally viewed. For example, an edge of the first area 251 may be formed to have a first radius of curvature and an edge of the second area 252 may be formed to have a second radius of curvature that is different from the first radius of curvature. In another example, the first area 251 and the second area 252 may be symmetrical in terms of thickness when cross-sectionally viewed.

Hereinafter, each area of the display 250 and operations of the first housing structure 210 and the second housing structure 220 depending on the state (e.g., a folded state, an unfolded state, or an intermediate state) of the electronic device 200) will be described.

According to various example embodiments, when the electronic device 200 is in the unfolded state (e.g., FIG. 2A), the first housing structure 210 and the second housing structure 220 may be arranged to face the same direction with an angle of 180 degrees therebetween. The surface of the first area 251 of the display 250 and the surface of the second area 252 thereof may face the same direction (e.g., a front direction of an electronic device). The folding area 253 may be disposed in the same plane together with the first area 251 and the second area 252.

According to various example embodiments, when the electronic device 200 is in the folded state (e.g., FIG. 2B), the first housing structure 210 and the second housing structure 220 may be arranged to face each other. The surface of the first area 251 and the surface of the second area 252 of the display 250 may face each other and may form a narrow angle (e.g., an angle between 0 degrees to 10 degrees) relative to each other. At least a portion of the folding area 253 may form a curved surface having a predetermined curvature.

According to various example embodiments, when the electronic device 200 is in the intermediate state (e.g., a half-folded state), the first housing structure 210 and the second housing structure 220 may be arranged to have a certain angle therebetween. The surface of the first area 251 and the surface of the second area 252 of the display 250 may form an angle greater than that in the folded state and smaller than that in the unfolded state. At least a portion of the folding area 253 may include a curved surface having a predetermined curvature, and the curvature may be less than that in the folded state.

The upper part of FIG. 2C illustrates a fully unfolded state of the electronic device 200 and the lower part of FIG. 2C illustrates a partially folded state, that is, an intermediate state of the electronic device 200. As described above, the state of the electronic device 200 may be changed to the folded state or the unfolded state. According to an example embodiment, when viewed in a direction of a folding axis (e.g., the folding axis A of FIG. 2A), the electronic device 200 may be folded in two folding types, i.e., an "in-folding" type in which the front surface of the electronic device 200 is folded to form an acute angle, and an "out-folding" type in which the front surface of the electronic device 200 is folded to form an obtuse angle. In an example, in the state in which the electronic device 200 is folded in the in-folding type, the first surface of the first housing structure 210 may face the third surface of the second housing structure 220. In the fully unfolded state, the first surface of the first housing structure 210 and the third surface of the second housing structure 220 may face the same direction (e.g., a direction parallel to the z-axis).

In another example, when the electronic device 200 is folded in the out-folding type, the second surface of the first housing structure 210 may face the fourth surface of the second housing structure 220.

In addition, although not shown in the drawings, the electronic device 200 may include a plurality of hinge axes (e.g., two parallel hinge axes including the folding axis A of FIG. 2A and another axis parallel to the folding axis A). In this example, the electronic device 200 may also be folded in a "multi-folding" folding type in which the in-folding folding type is combined with the out-folding folding type.

The in-folding folding type may refer, for example, to a state in which the display 250 is not exposed to the outside in the fully folded state. The out-folding folding type may refer, for example, to a state in which the display 250 is visually exposed to the outside in the fully folded state. The lower part of FIG. 2C shows an intermediate state in which the electronic device 200 is partially unfolded in an in-folding process.

Although the state in which the electronic device 200 is folded in the in-folding folding type will be described below for convenience's sake, it should be noted that the description may be similarly applied to the state in which the electronic device 200 is folded in the out-folding folding type.

The electronic device according to various example embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that various example embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "1st" or "2nd" may simply be used to distinguish the component from other components in question, and do not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various example embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

Various example embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Here, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an example embodiment, a method according to various example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 3:
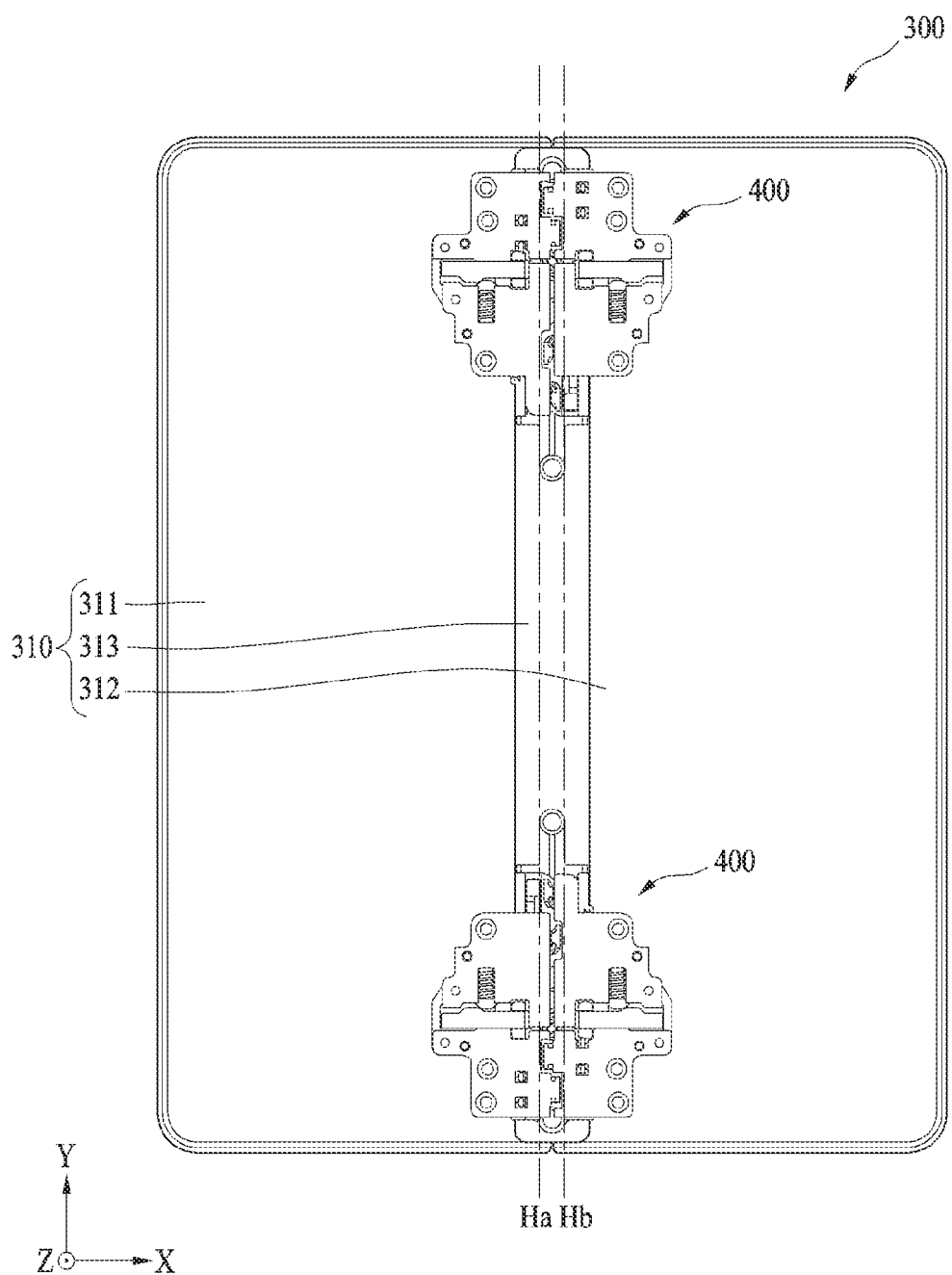
FIG. 3 is a front view illustrating a state in which a hinge assembly is applied to an electronic device according to an example embodiment.

FIG. 3 is a front view illustrating a state in which a hinge assembly is applied to an electronic device according to an example embodiment.

Referring to FIG. 3, an electronic device 300 (e.g., the electronic device 101 of FIG. 1 or the electronic device 200 of FIGS. 2A, 2B, and 2C) according to an example embodiment may be a foldable electronic device. For example, the electronic device 300 may be folded or unfolded based on a pair of hinge axes Ha and Hb. The pair of hinge axes Ha and Hb may be substantially parallel with each other. However, FIG. 3 is merely an example, and the size, the shape, the structure, and the hinge axes of the electronic device 300 are not limited thereto. For example, the electronic device 300 of FIG. 3 may include the hinge axis Ha or Hb in the y-axis direction, which is a long side direction, however, an electronic device according to an example embodiment may also include a hinge axis in the x-axis direction, which is a short side direction.

The electronic device 300 according to an example embodiment may include a housing 310 (e.g., the foldable housing 201 of FIGS. 2A, 2B, and 2C), a display (not shown) (e.g., the display module 160 of FIG. 1, or the display 250 of FIGS. 2A, 2B, and 2C), and a hinge assembly 400.

In an example embodiment, the housing 310 may form at least a portion of external surfaces of the electronic device 300. The housing 310 may include a first housing 311 (e.g., the first housing structure 210 of FIGS. 2A, 2B, and 2C), a second housing 312 (e.g., the second housing structure 220 of FIGS. 2A, 2B, and 2C), and a hinge housing 313.

In an example embodiment, the first housing 311 and the second housing 312 may be foldably connected to each other by the hinge assembly 400. An angle or distance between the first housing 311 and the second housing 312 may vary depending on whether the electronic device 300 is in a flat state or unfolded state, a folded state, or an intermediate state. The intermediate state described above may include all states between the unfolded state and the folded state. The hinge housing 313 may be disposed between the first housing 311 and the second housing 312 to provide a space for mounting internal components (e.g., the hinge assembly 400). For example, the hinge housing 313 may be configured to cover the hinge assembly 400 such that the hinge assembly 400 is not exposed to the outside.

In an example embodiment, the first housing 311 and the second housing 312 may provide a space in which the display 250 is disposed. The display 250 may be a foldable flexible display. For example, the display 250 may include a first area (e.g., the first area 251 of FIG. 2C), a second area (e.g., the second area 252 of FIG. 2C), and a folding area (e.g., the folding area 253 of FIG. 2C) between the first area and the second area. The first housing 311 may be disposed at a position corresponding to the first area 251 of the display 250 to support the first area 251 of the display 250. The second housing 312 may be disposed at a position corresponding to the second area 252 of the display 250 to support the second area 252 of the display 250.

In an example embodiment, the hinge assembly 400 may be disposed between the first housing 311 and the second housing 312 to connect the first housing 311 to the second housing 312. For example, the hinge structure covered by hinge cover 230 of FIG. 2B may include a plurality of hinge assemblies 400. The plurality of hinge assemblies 400 may be spaced apart from each other along the hinge axis Ha or Hb. For example, as shown in FIG. 3, two hinge assemblies 400 may be spaced apart along the hinge axis Ha or Hb. However, this is merely an example, and the number of hinge assemblies 400 is not limited thereto. The hinge assembly 400 may implement folding or unfolding operations of the electronic device 300. The hinge assembly 400 may operate between a folded state in which the first area 251 and the second area 252 face each other and an unfolded state in which the first area 251 and the second area 252 do not face each other. The hinge assembly 400 may generate a force to maintain a specific folded state of the electronic device 300. For example, when the electronic device 300 is in the folded state, the hinge assembly 400 may generate a force for allowing the electronic device 300 to remain in the folded state. When the electronic device 300 is in the unfolded state, the hinge assembly 400 may generate a force for allowing the electronic device 300 to remain in the unfolded state. When the electronic device 300 is in the intermediate state, the hinge assembly 400 may generate a force for allowing the electronic device 300 to remain in the intermediate state. In addition, the hinge assembly 400 may synchronize a folding angle of the first housing 311 with a folding angle of the second housing 312. For example, the hinge assembly 400 may interoperate a folding operation of the first housing 311 with a folding operation of the second housing 312 such that the folding angle of the first housing 311 may be synchronized with the folding angle of the second housing 312.

Figure 4A:
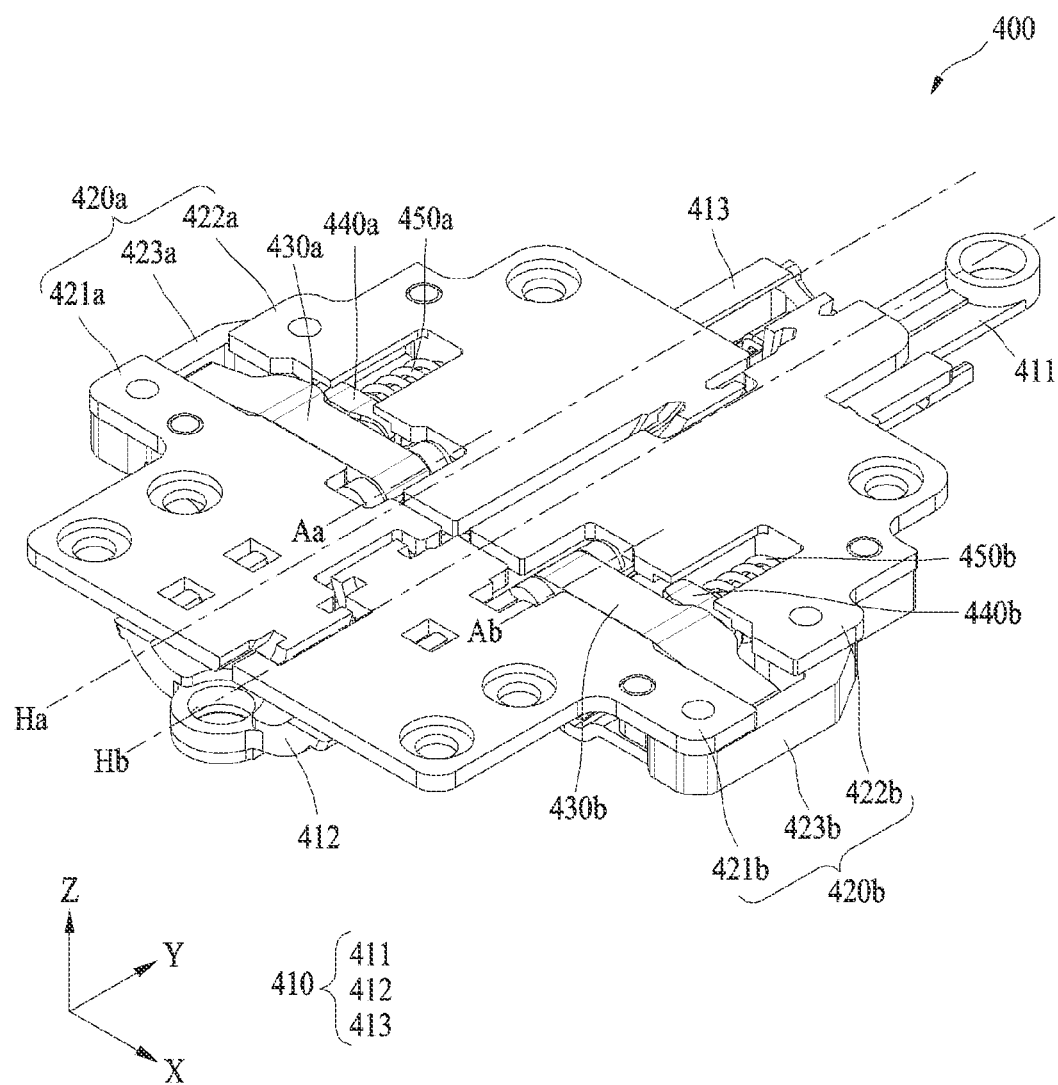
FIG. 4A is a perspective view illustrating an unfolded state of a hinge assembly according to an example embodiment.
Figure 4B:
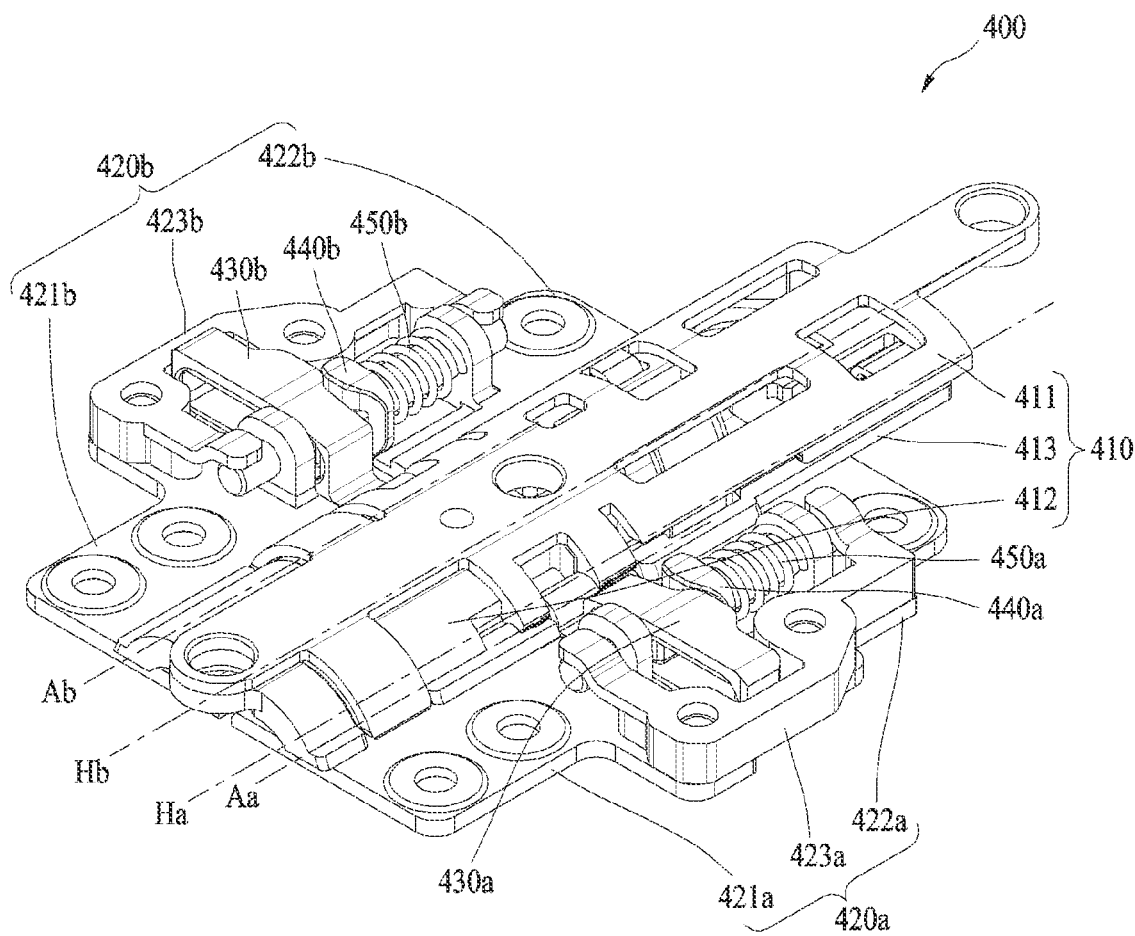
FIG. 4B is a rear perspective view illustrating an unfolded state of the hinge assembly according to an example embodiment.
Figure 4C:
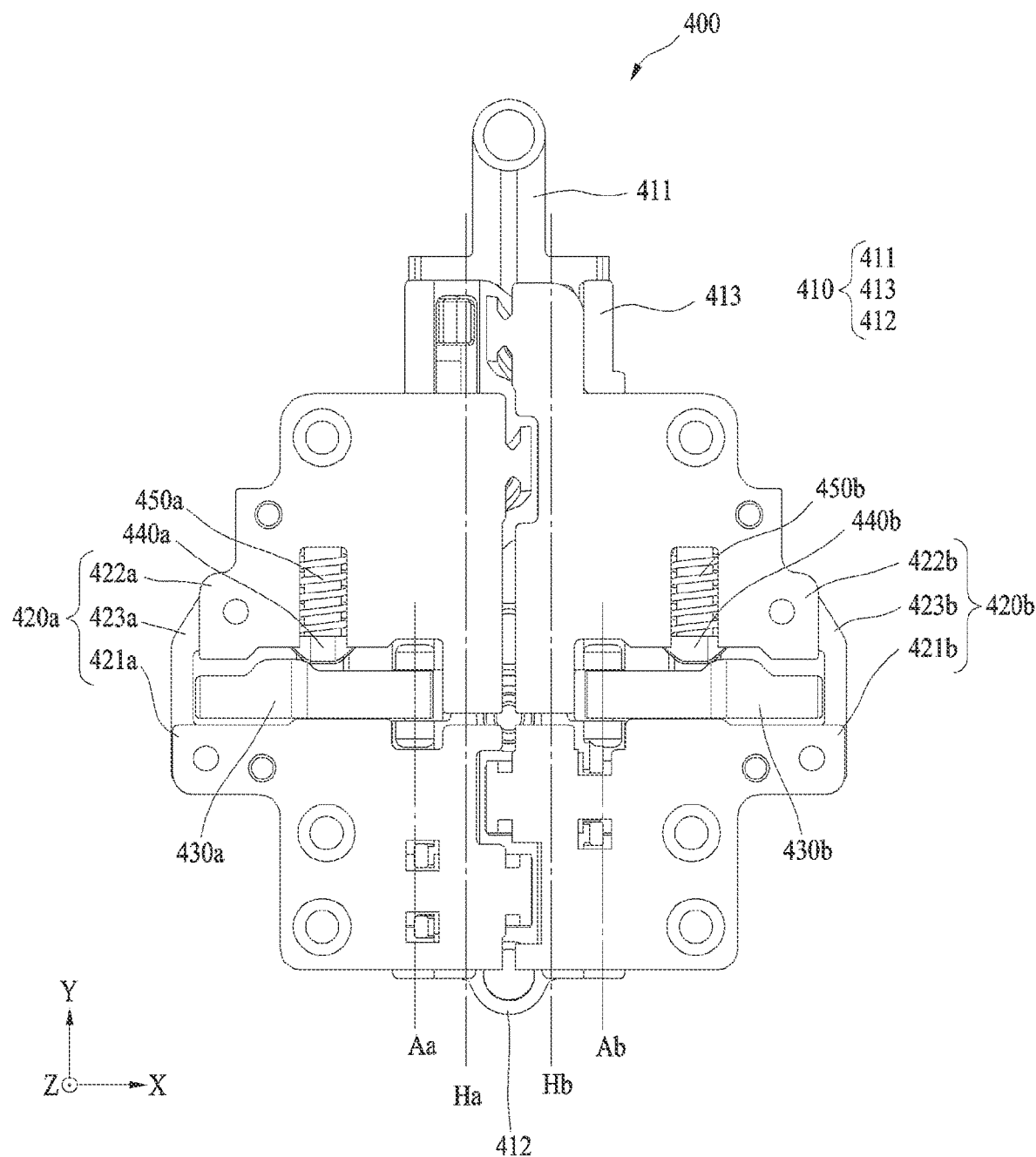
FIG. 4C is a front view illustrating an unfolded state of the hinge assembly according to an example embodiment.
Figure 4D:
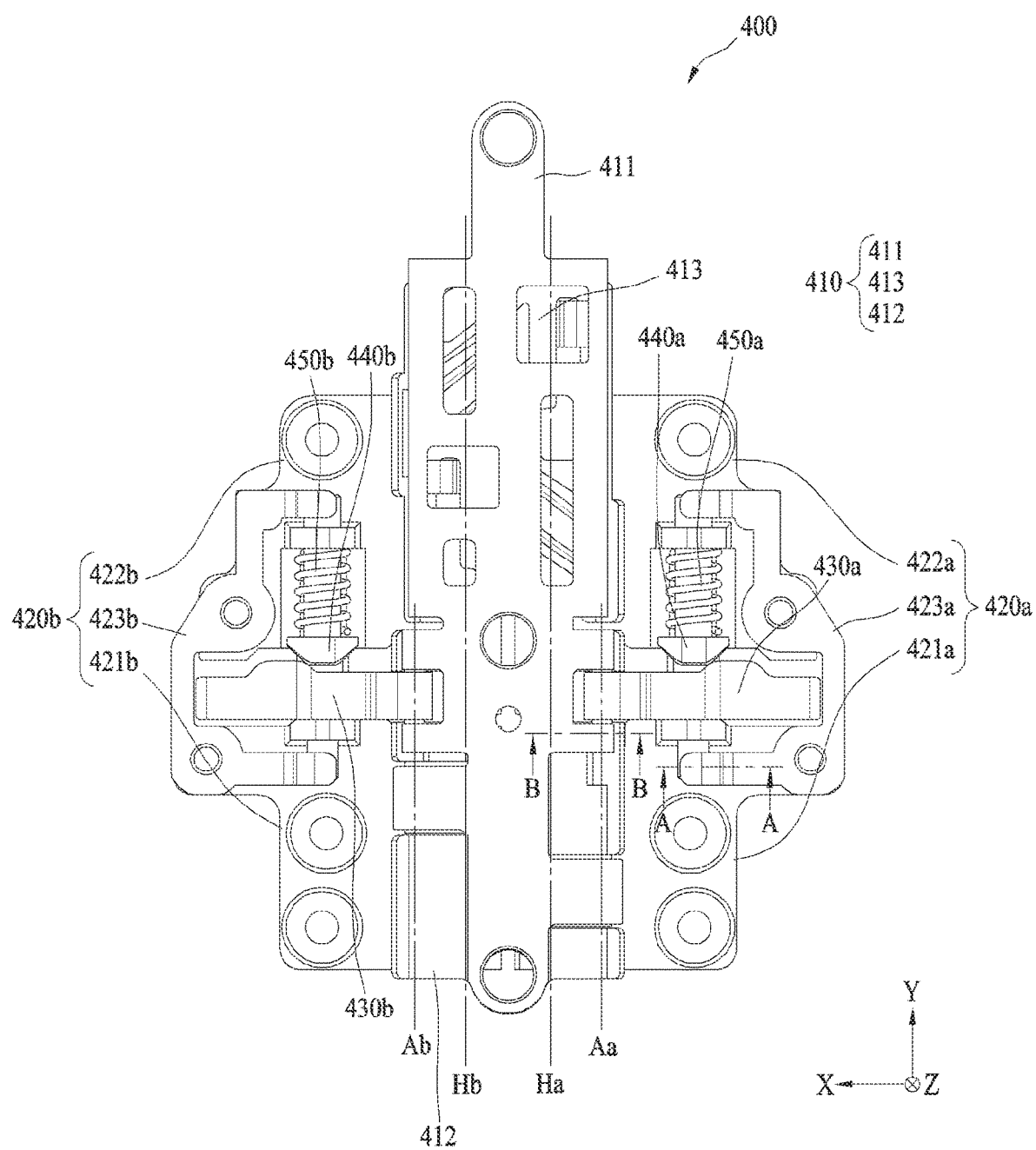
FIG. 4D is a rear view illustrating an unfolded state of the hinge assembly according to an example embodiment.
Figure 4E:
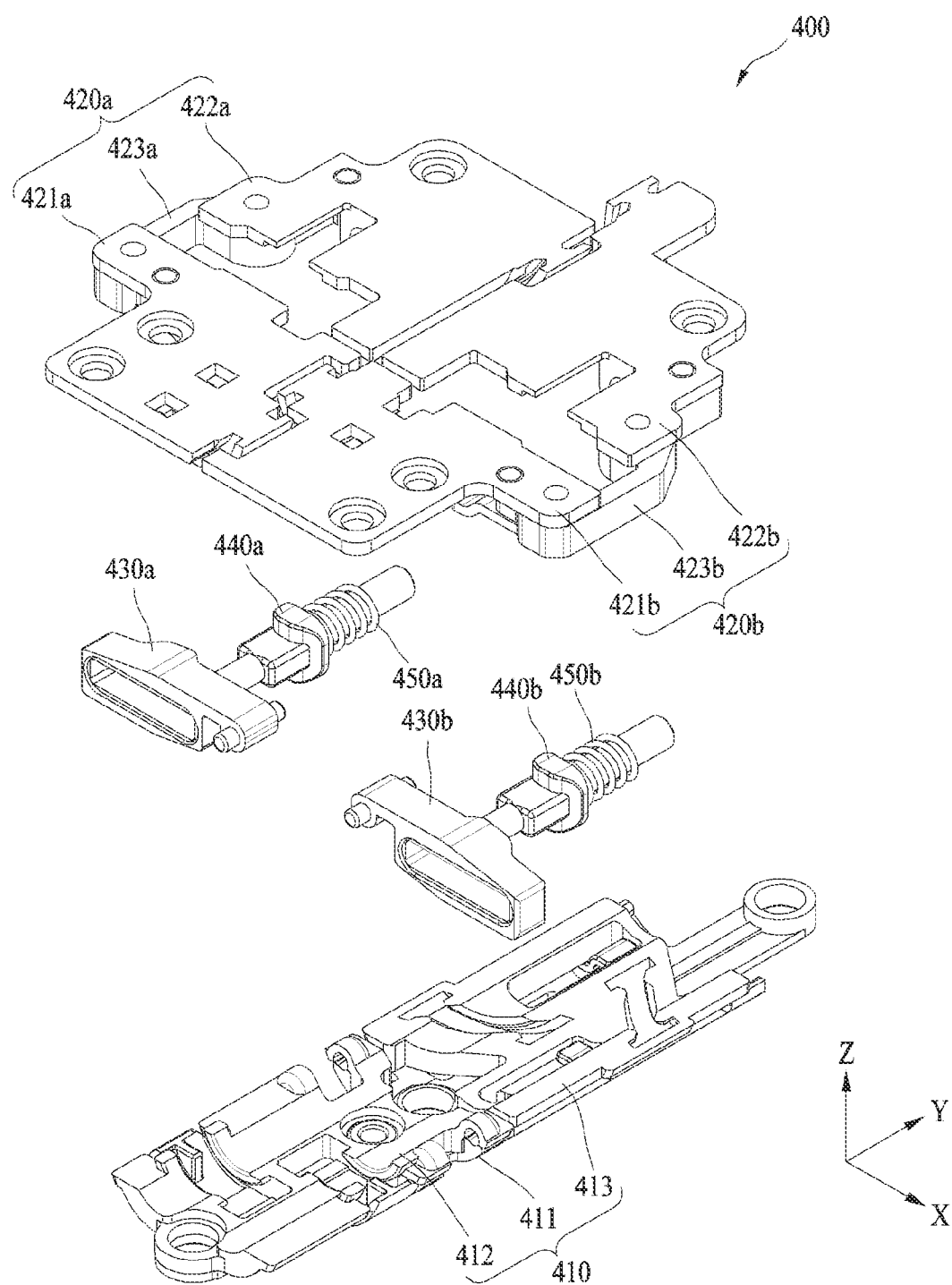
FIG. 4E is an exploded perspective view illustrating the hinge assembly according to an example embodiment.

FIG. 4A is a perspective view illustrating an unfolded state of a hinge assembly according to an example embodiment. FIG. 4B is a rear perspective view illustrating an unfolded state of the hinge assembly according to an example embodiment. FIG. 4C is a front view illustrating an unfolded state of the hinge assembly according to an example embodiment. FIG. 4D is a rear view illustrating an unfolded state of a hinge assembly according to an example embodiment. FIG. 4E is an exploded perspective view illustrating the hinge assembly according to an example embodiment.

Referring to FIGS. 4A, 4B, 4C, 4D, and 4E, a hinge assembly 400 according to an example embodiment may include a bracket structure 410, a pair of rotator structures 420a and 420b, a pair of arms 430a and 430b, a pair of pins 440a and 440b, and a pair of elastic members 450a and 450b.

Figure 4F:
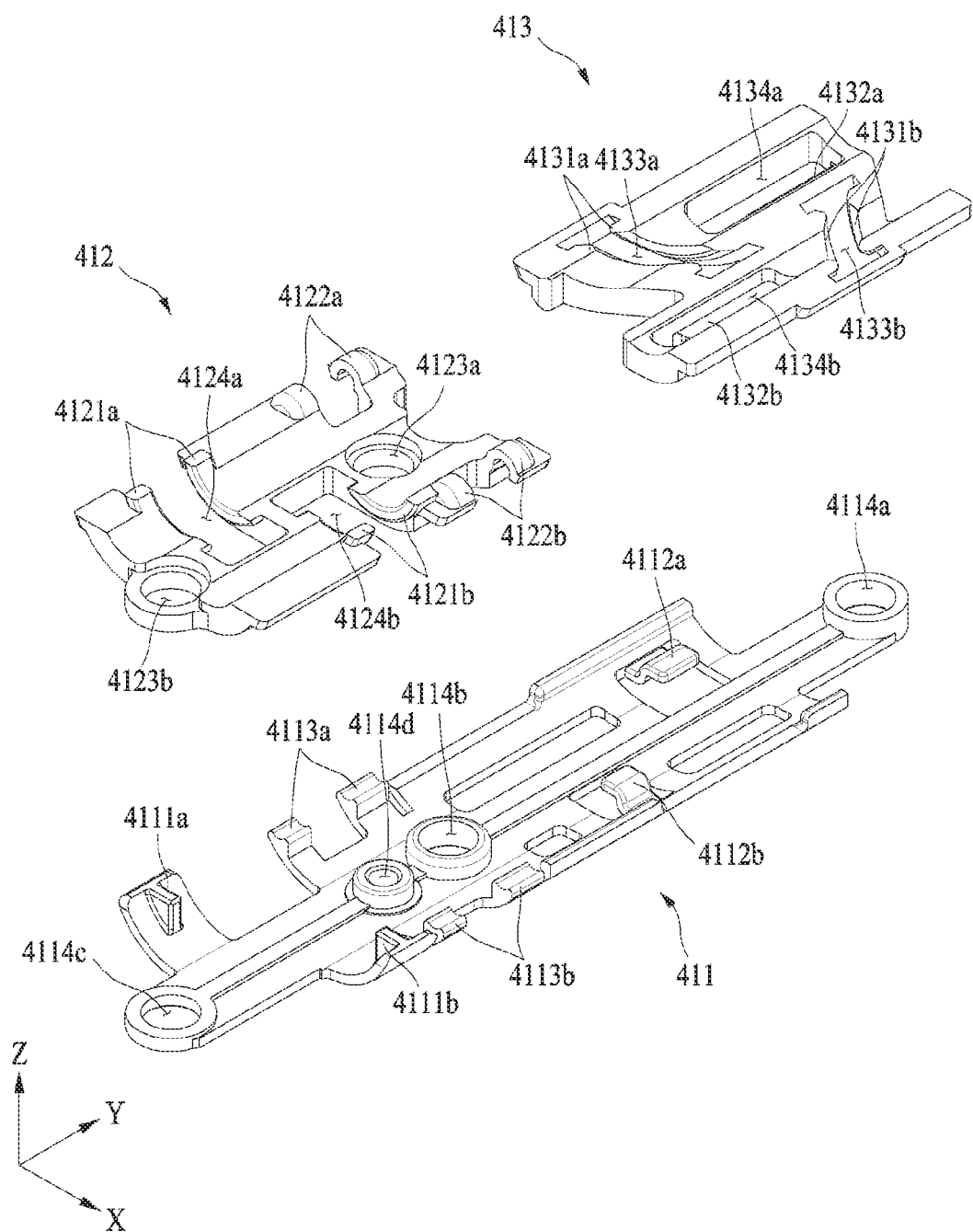
FIG. 4F is an exploded perspective view illustrating a bracket structure according to an example embodiment.
Figure 4G:
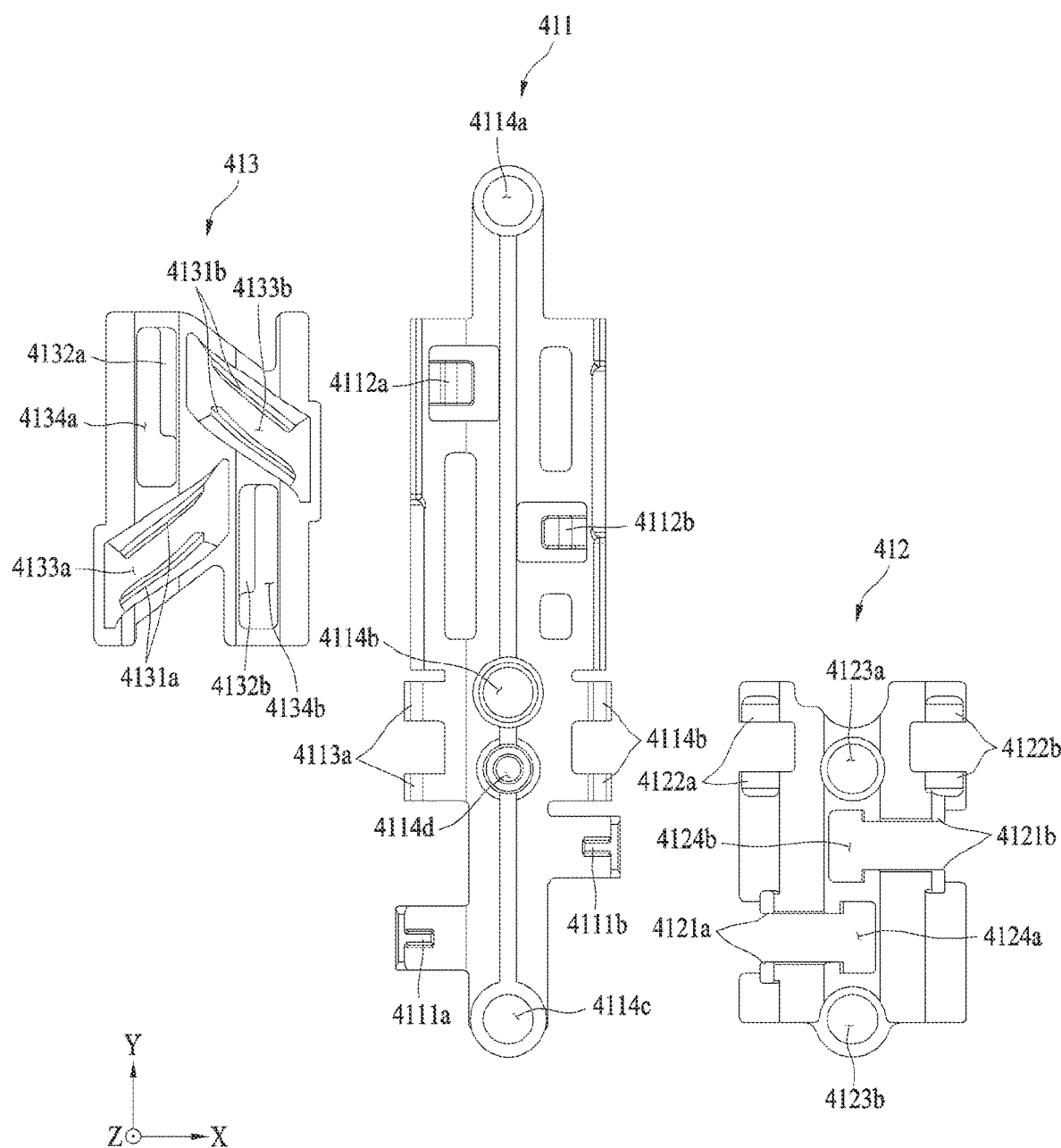
FIG. 4G is an exploded front view illustrating the bracket structure according to an example embodiment.

FIG. 4F is an exploded perspective view illustrating a bracket structure according to an example embodiment. FIG. 4G is an exploded front view illustrating the bracket structure according to an example embodiment.

Referring to FIGS. 4A, 4B, 4C, 4D, 4E, 4F, and 4G, the bracket structure 410 may be fixedly connected to a hinge housing (e.g., the hinge housing 313 of FIG. 3). The pair of rotator structures 420a and 420b may be connected to the bracket structure 410 and respectively rotatable on a pair of hinge axes Ha and Hb, and the pair of arms 430a and 430b may be connected to the bracket structure 410 and respectively rotatable on a pair of arm axes Aa and Ab.

In an example embodiment, the bracket structure 410 may include a main bracket 411, a first bracket 412, and a second bracket 413.

Referring to FIGS. 4A, 4B, 4C, 4D, 4E, 4F, and 4G, in an example embodiment, the main bracket 411 may be fixedly connected to the hinge housing (e.g., the hinge housing 313 of FIG. 3). Bracket connection holes 4114a, 4114b, and 4114c may be formed in the main bracket 411 to be connected to the hinge housing 313. For example, the main bracket 411 may be fixedly connected to the hinge housing 313 by a fastening member (e.g., a screw, a bolt, a pin, and/or a combination fastening structure) that is inserted into the bracket connection holes 4114a, 4114b, and 4114c. The main bracket 411 may be formed to have a longitudinal direction (e.g., the y-axis direction) parallel with the hinge axis Ha or Hb. The lower surface (e.g., a surface in the −z direction) of the main bracket 411 may be formed to substantially correspond to the inner shape of the hinge housing 313.

In an example embodiment, the main bracket 411 may include a pair of rotation guides 4111a and 4111b, a pair of sliding projections 4112a and 4112b, and a pair of arm axis pressurizers 4113a and 4113b.

In an example embodiment, the pair of rotation guides 4111a and 4111b may assist a pair of first rotators 421a and 421b to rotate with respect to the first bracket 412 described below. The pair of rotation guides 4111a and 4111b may interoperate with a second rotation groove (e.g., a second rotation groove 42132 of FIG. 4H) of the first rotator 421a or 421b described below.

In an example embodiment, the rotation guide 4111a or 4111b may be formed in a lower portion (e.g., a portion in the −y direction) of the main bracket 411. The rotation guide 4111a or 4111b may protrude from both ends (e.g., ends in the −x and +x directions) of the main bracket 411. For example, with reference to FIG. 4G, the rotation guide 4111a may protrude from the left end (e.g., the end in the −x direction) of the main bracket 411 toward the right direction (e.g., the +x direction) and the other rotation guide 4111b may protrude from the right end (e.g., the end in the +x direction) of the main bracket 411 toward the left direction (e.g., the −x direction). For example, the rotation guide 4111a may be positioned at a relatively lower side (e.g., the −y direction side) than the other rotation guide 4111b. However, this is an example, and the number, shape, and/or location of the pair of rotation guides 4111a and 4111b is not limited thereto.

In an example embodiment, the pair of sliding projections 4112a and 4112b may be configured to slidably connect the second bracket 413 to the main bracket 411. The sliding projection 4112a or 4112b may interoperate with a sliding rail 4132a or 4132b of the second bracket 413 described below.

In an example embodiment, the sliding projection 4112a or 4112b may be formed in an upper portion (e.g., a portion in the +y direction) of the main bracket 411. The sliding projection 4112a or 4112b may protrude by a designated width in a direction (e.g., the +x direction or the −x direction) perpendicular to the hinge axis Ha or Hb from a position apart from the front surface (e.g., the surface in the +z direction) of the main bracket 411 by a designated height. For example, with reference to FIG. 4G, the sliding projection 4112a may protrude by a designated width in the right direction (e.g., the +x direction) from a position apart, by a designated height, from the front surface (e.g., the surface in the +z direction) (e.g., the −x direction side) of the main bracket 411 on the left side of the of the main bracket 411, and the other sliding projection 4112b may protrude by a designated width in the left direction (e.g., the −x direction) from a position apart, by a designated height, from the front surface (e.g., the surface in the +z direction) (e.g., the +x direction side) of the main bracket 411 on the right side of the main bracket 411. For example, the sliding projection 4112b may be positioned at a relatively lower side (e.g., the −y direction side) than the other sliding projection 4112a. However, this is an example, and the number, shape, and/or location of the pair of sliding projections 4112a and 4112b is not limited thereto.

Figure 4H:
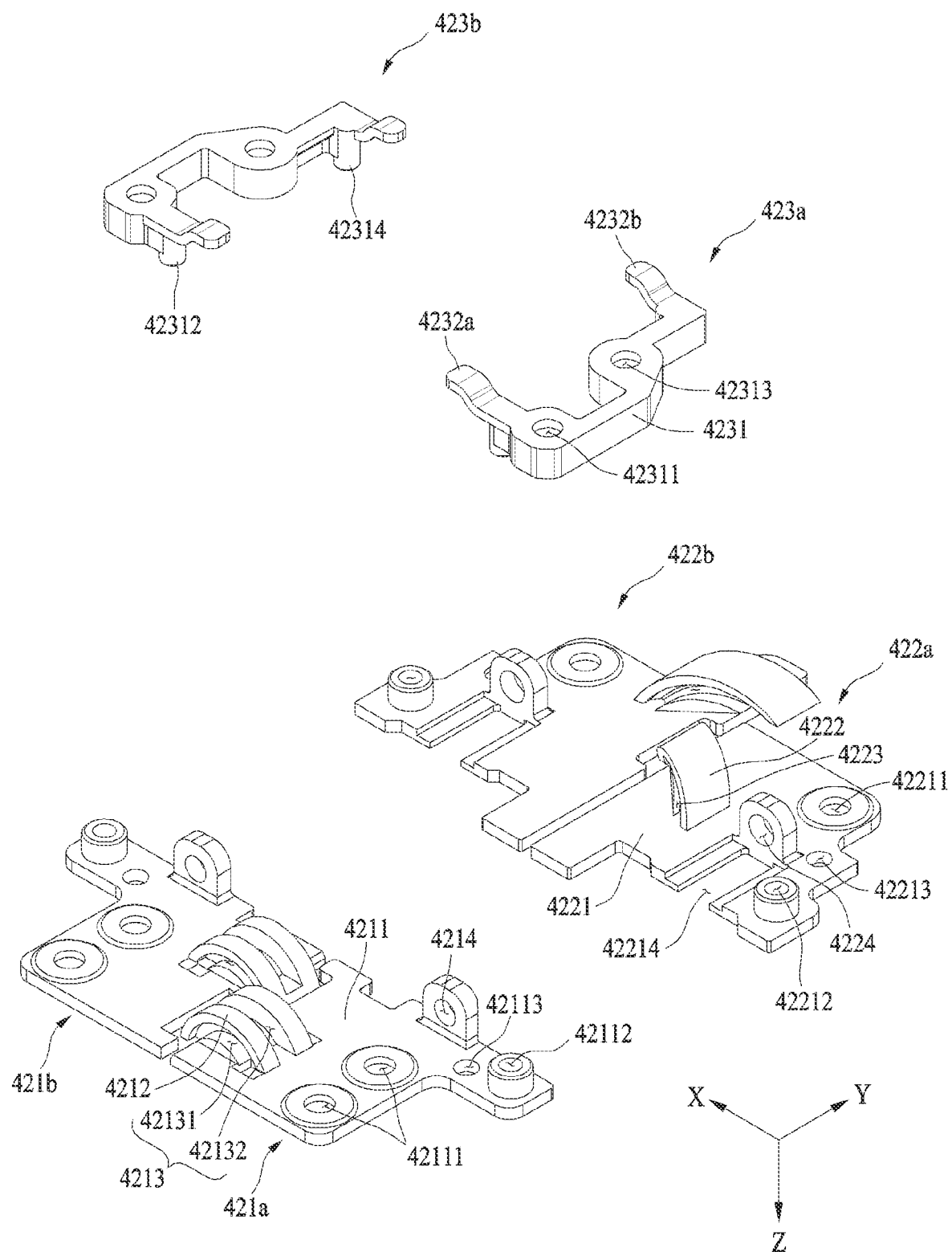
FIG. 4H is an exploded rear perspective view illustrating a pair of rotator structures according to an example embodiment.
Figure 4I:
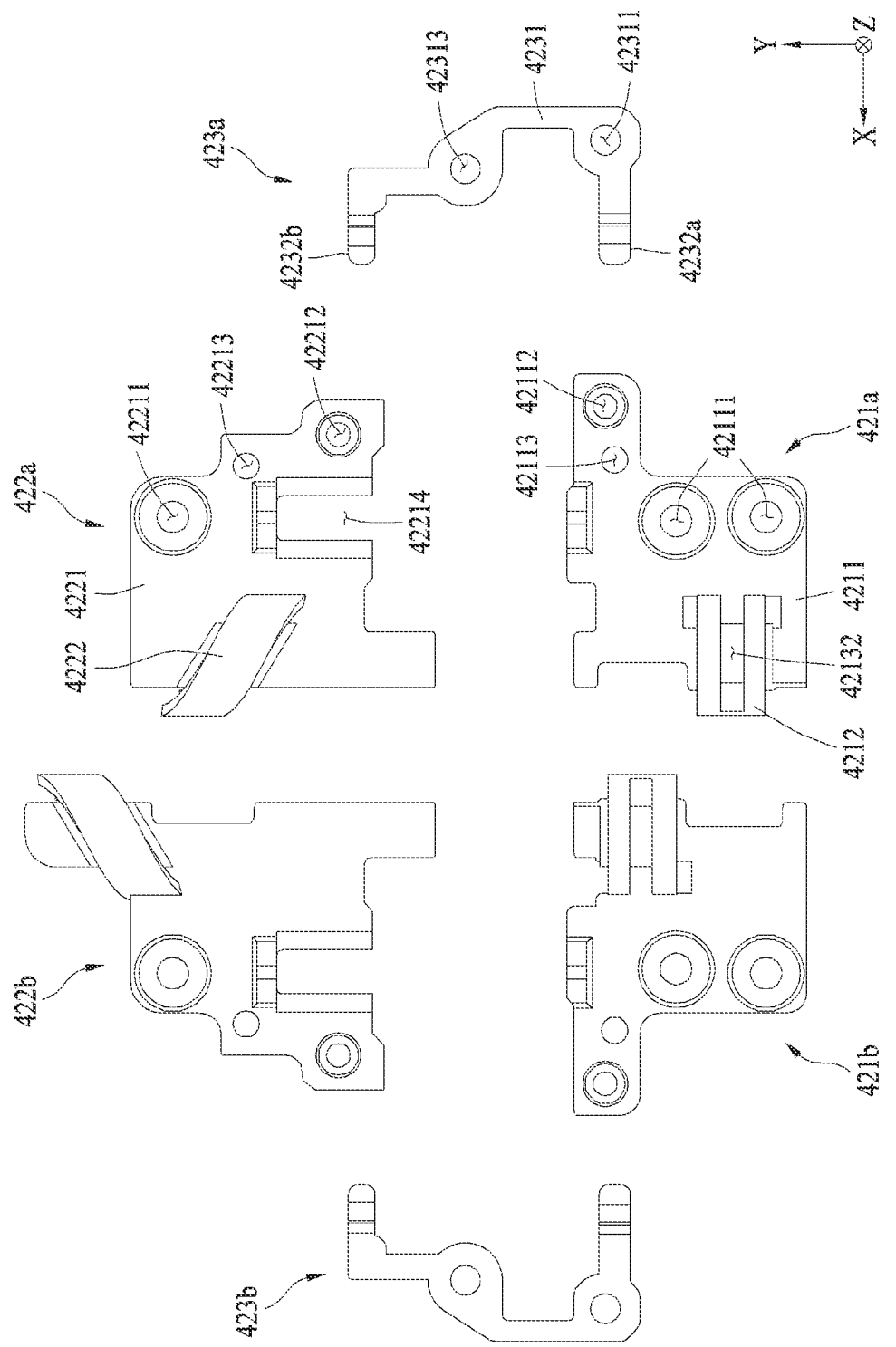
FIG. 4I is an exploded rear view illustrating the pair of rotator structures according to an example embodiment.
Figure 4J:
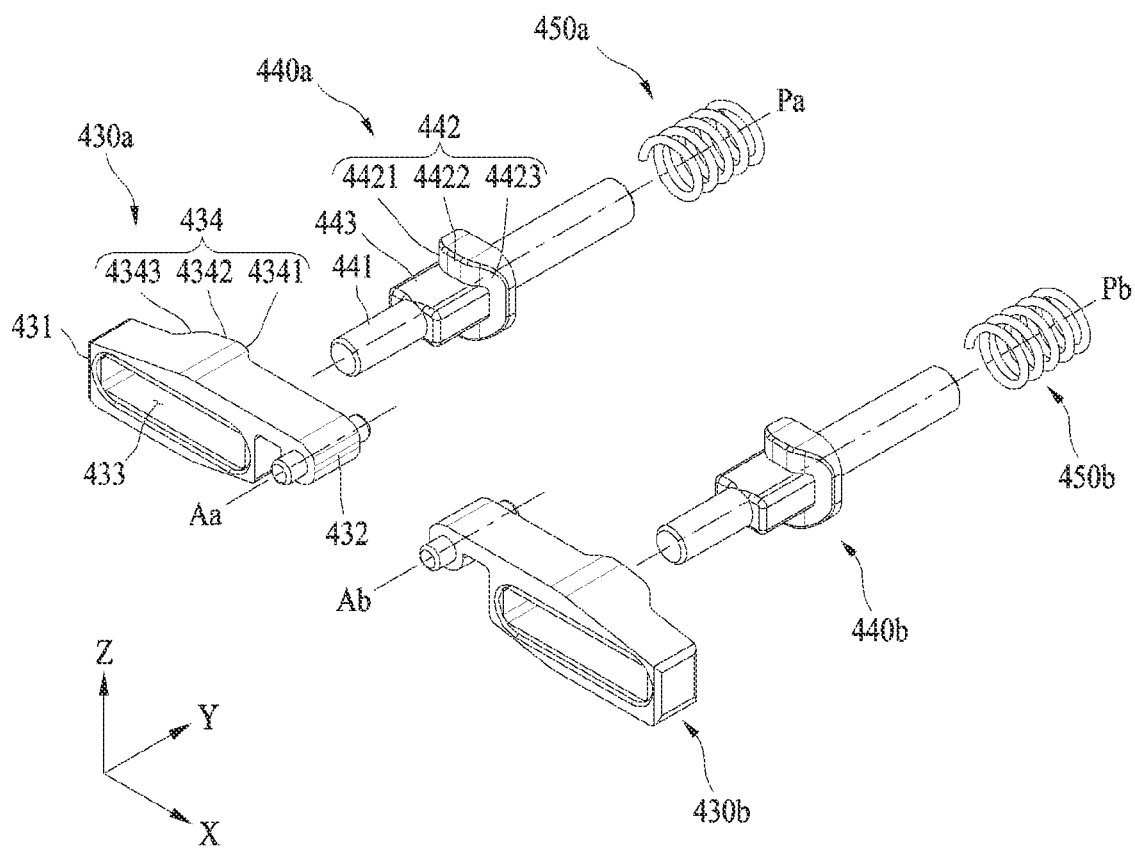
FIG. 4J is a perspective view illustrating a pair of arms, a pair of pins, and a pair of elastic members according to an example embodiment.
Figure 4K:
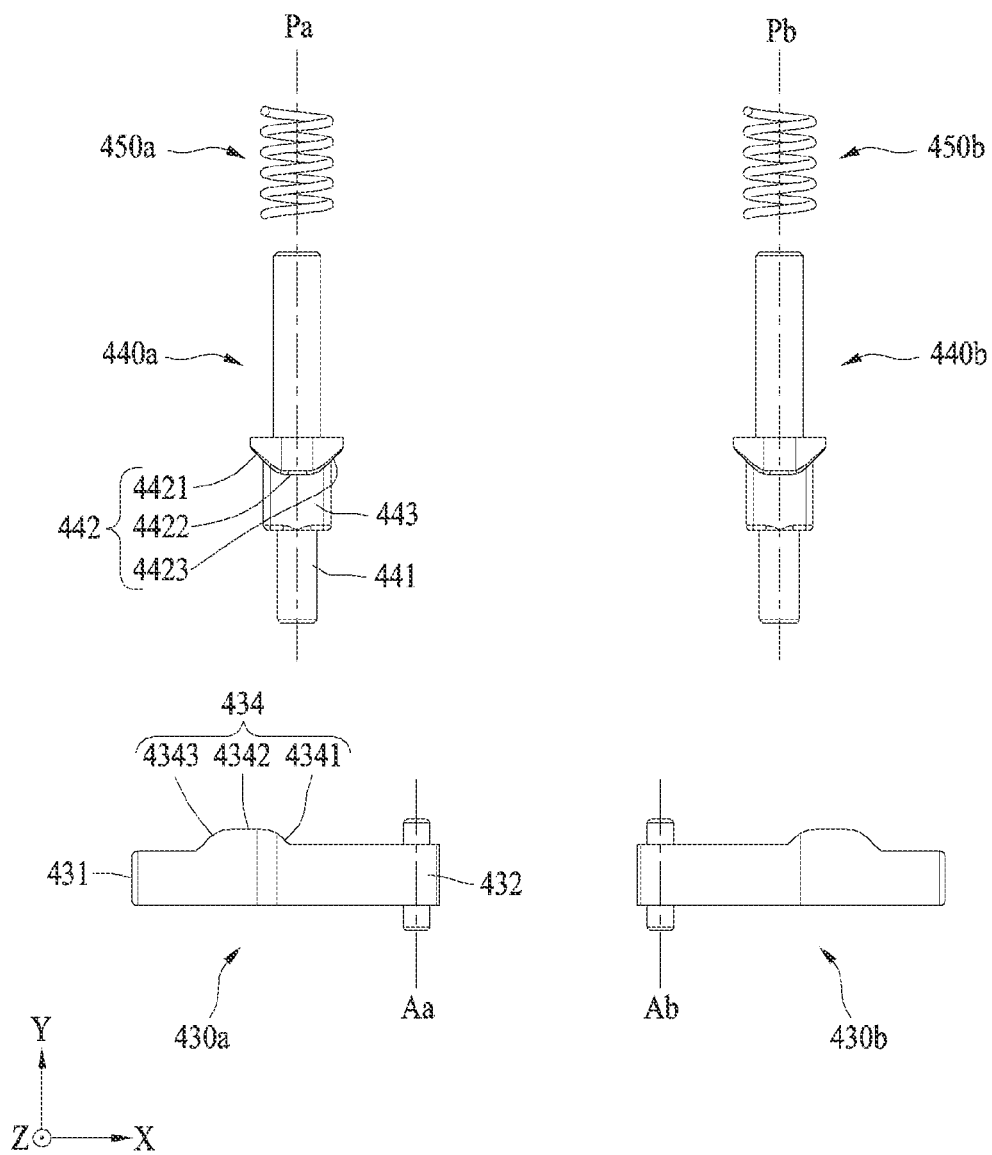
FIG. 4K is a front view illustrating the pair of arms, the pair of pins, and the pair of elastic members according to an example embodiment.
Figure 4L:
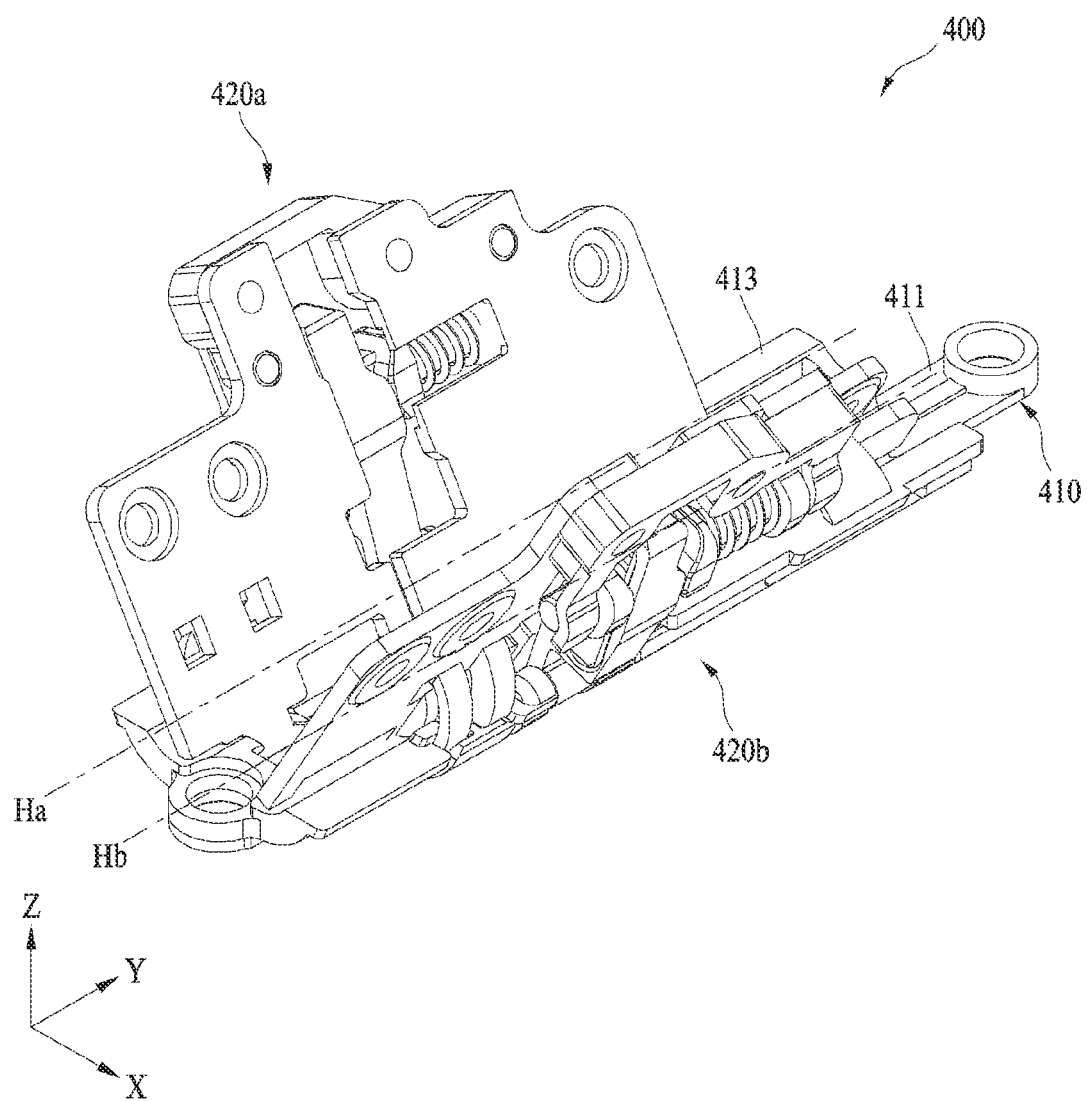
FIG. 4L is a perspective view illustrating an intermediate state of the hinge assembly according to an example embodiment.
Figure 4M:
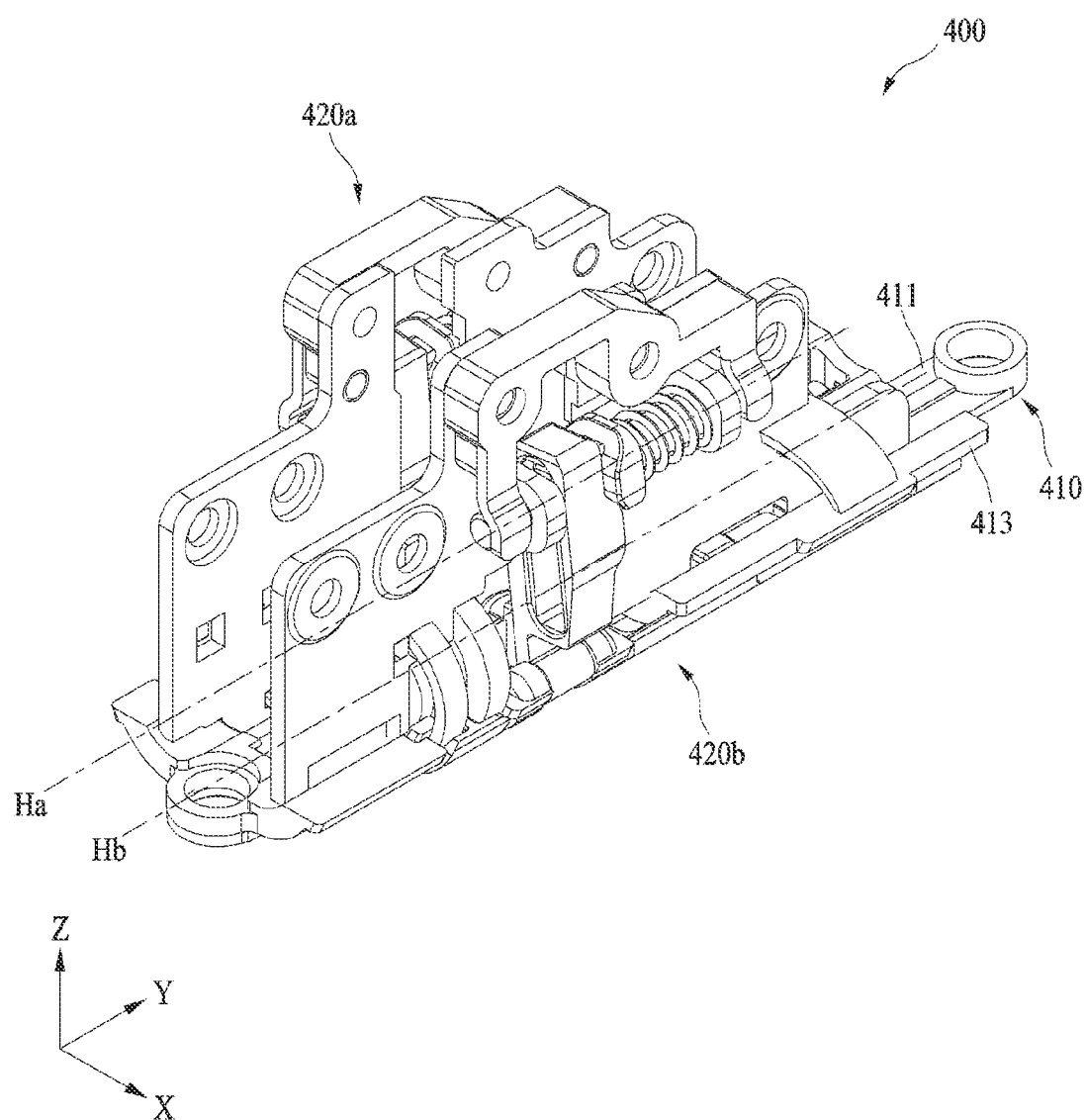
FIG. 4M is a perspective view illustrating a folded state of the hinge assembly according to an example embodiment.
Figure 4N:
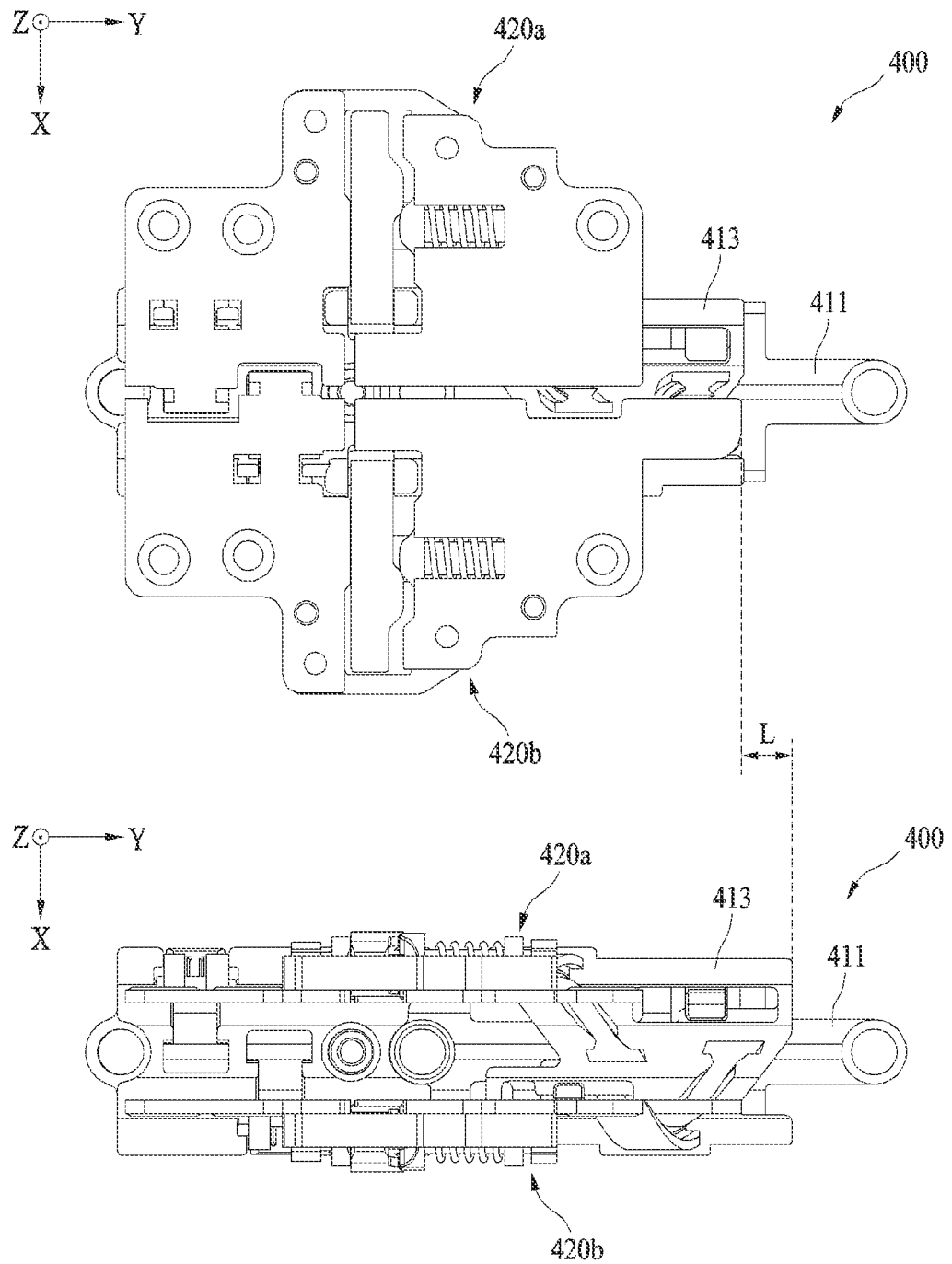
FIG. 4N is a front view illustrating an unfolded state and a folded state of the hinge assembly according to an example embodiment.
Figure 40:
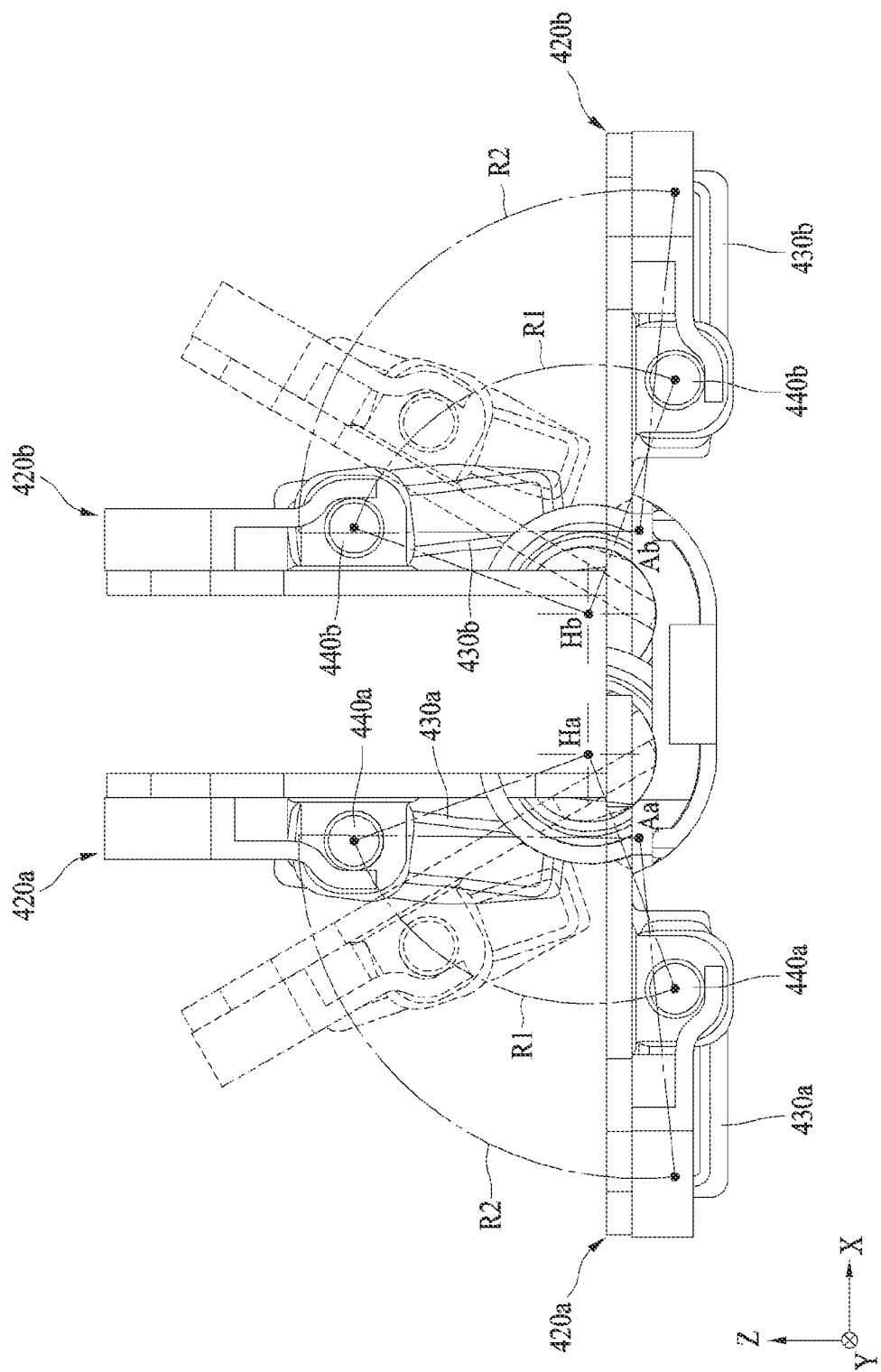
Figure 4P:
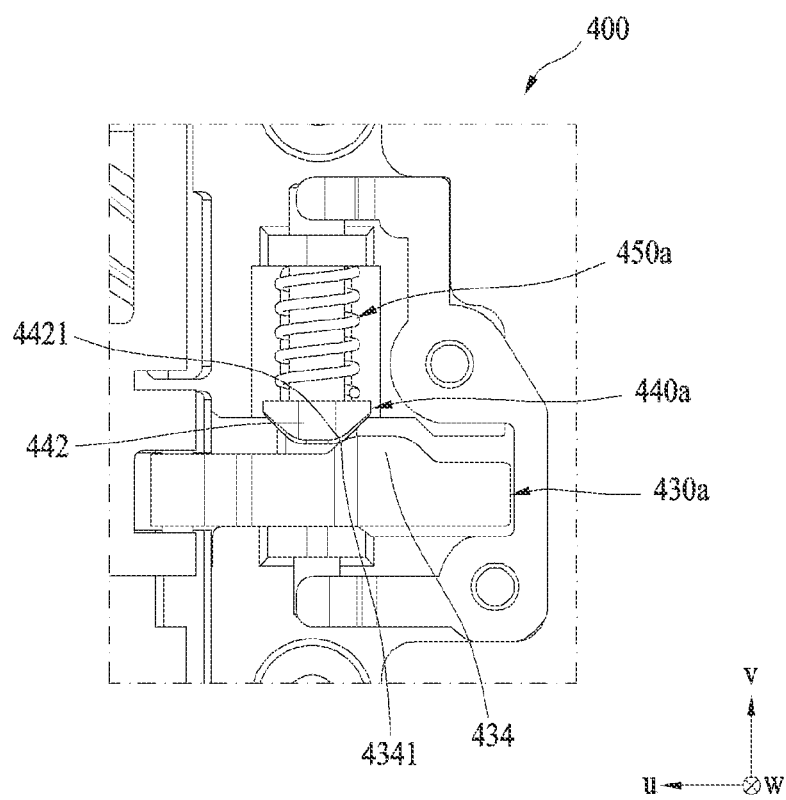
FIG. 4P is a partial rear view based on a rotator structure in an unfolded state of the hinge assembly according to an example embodiment.
Figure 4Q:
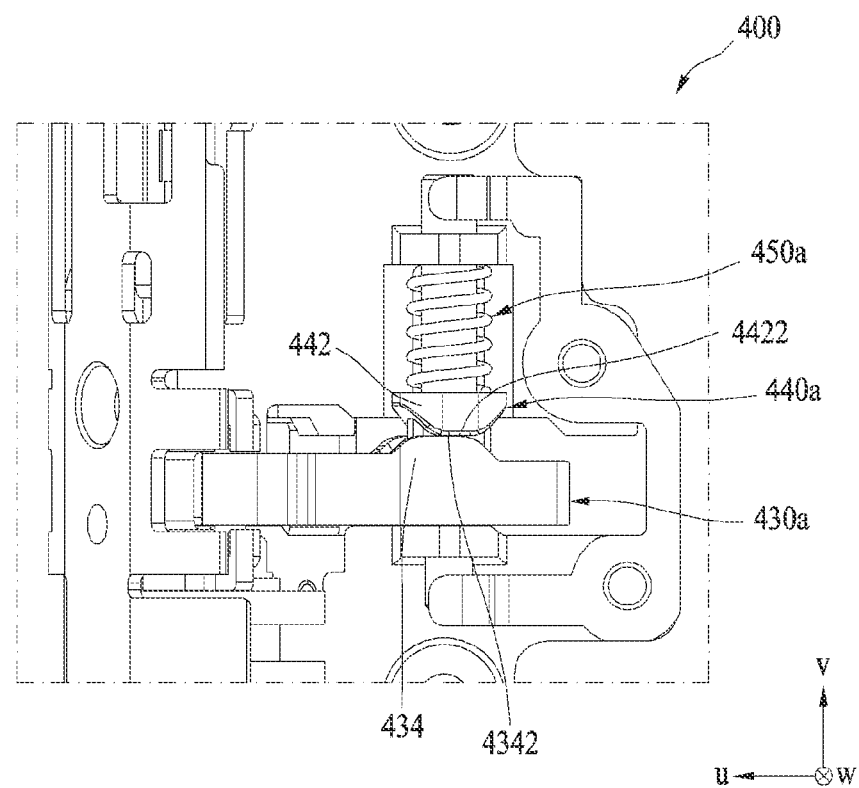
FIG. 4Q is a partial rear view based on a rotator structure in an unfolded state of the hinge assembly according to an example embodiment.
Figure 4R:
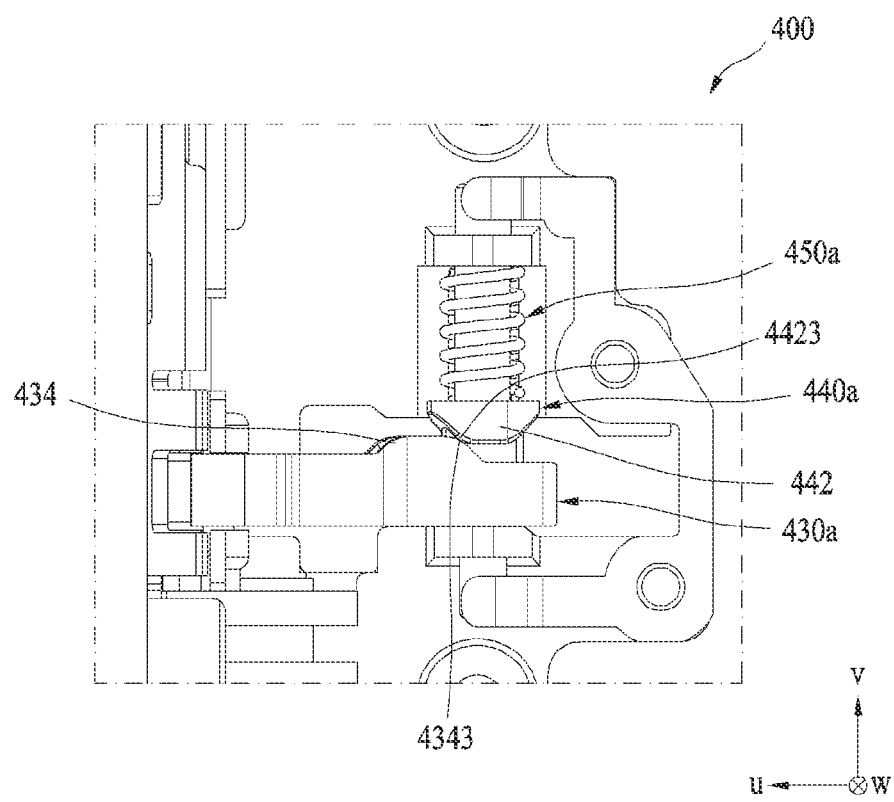
FIG. 4R is a partial rear view based on a rotator structure in an unfolded state of the hinge assembly according to an example embodiment.
Figure 4S:
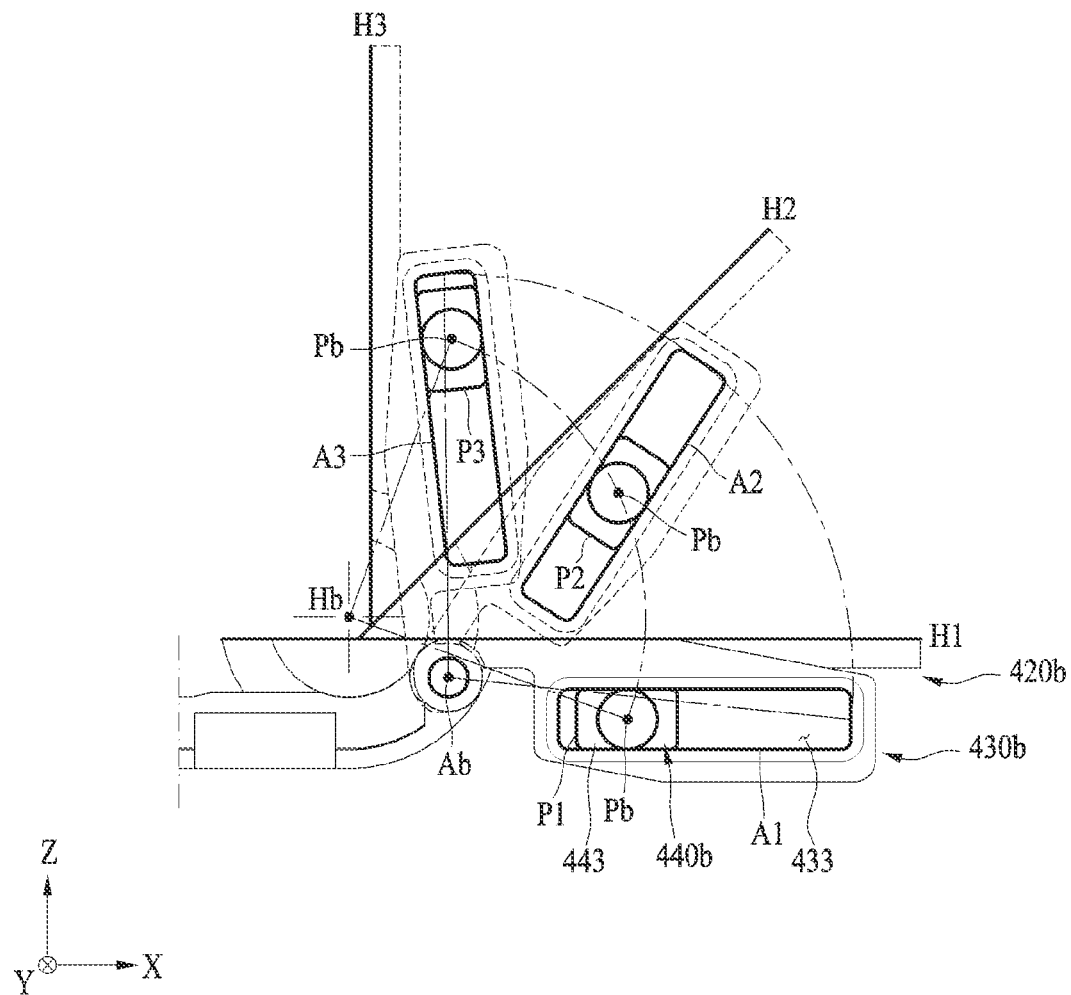
FIG. 4S is a schematic view illustrating by overlapping side views of an unfolded state, an intermediate state, and a folded state of the hinge assembly according to an example embodiment.
Figure 4T:
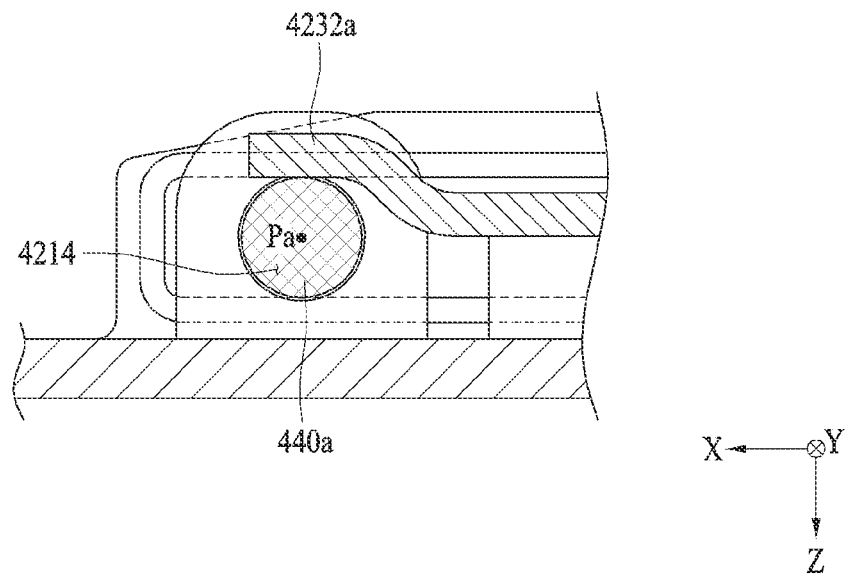
FIG. 4T is a cross-sectional view taken along line A-A of FIG. 4D.
Figure 4U:
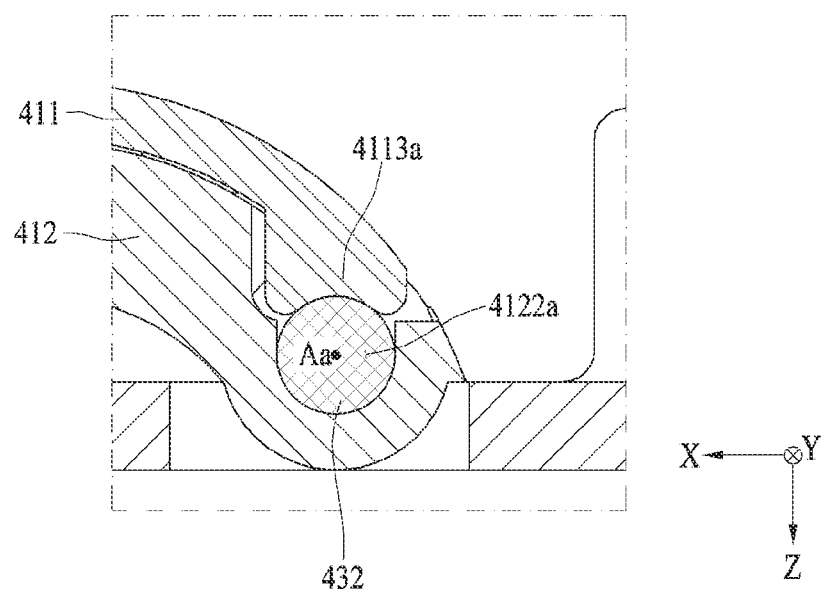
FIG. 4U is a cross-sectional view taken along line B-B of FIG. 4D.

In an example embodiment, with reference to FIG. 4U, the pair of arm axis pressurizers 4113a and 4113b may be configured to press an arm rotating part (e.g., an arm rotating part 432 of FIG. 4J) of the pair of arms 430a and 430b in a direction (e.g., the +z direction) perpendicular to the arm axes Aa and Ab. The pair of arm axis pressurizers 4113a and 4113b may be formed in the lower portion (e.g., the portion in the −y direction) of the main bracket 411. For example, the pair of arm axis pressurizers 4113a and 4113b may be symmetrical with respect to the y-axis. The arm axis pressurizer 4113a or 4113b may include a shape substantially corresponding to the outer circumferential surface of the arm rotating part 432. A detailed description of the arm axis pressurizer 4113a or 4113b is provided with reference to FIG. 4U.

Referring to FIGS. 4A, 4B, 4C, 4D, 4E, 4F, and 4G, in an example embodiment, the first bracket 412 may be fixedly connected to the main bracket 411. For example, the first bracket 412 may be fixedly connected to the lower portion of the main bracket 411 (e.g., the portion in the −y direction) from the front surface side (e.g., the +z direction side) of the main bracket 411. For connecting to the main bracket 411, bracket connection holes 4123a and 4123b may be formed in the first bracket 412. For example, the first bracket 412 may be fixedly connected to the main bracket 411 by a fastening member (e.g., a screw, a bolt, a pin, and/or a combination fastening structure) that is inserted into the bracket connection holes 4123a, 4123b, 4114d, and 4114c.

In an example embodiment, the first bracket 412 may include a pair of rotation rails 4121a and 4121b and a pair of arm axis insertion portions 4122a and 4122b.

In an example embodiment, the pair of rotation rails 4121a and 4121b may be configured to rotatably connect the pair of first rotators 421a and 421b, described below, to the first bracket 412. The rotation rail 4121a or 4121b may interoperate with a first rotation groove (e.g., a first rotation groove 42131 of FIG. 4H) of the first rotator 421a or 421b. The rotation rail 4121a or 4121b may include an arc shape, and the center of the arc shape of the rotation rail 4121a or 4121b may be defined by the hinge axis Ha or Hb. For example, the rotation rail 4121a or 4121b may include the arc shape with the hinge axis Ha or Hb as the center.

In an example embodiment, the rotation rail 4121a or 4121b may be formed in a rotation space 4124a or 4124b, which is a cut-out portion of the first bracket 412. The rotation space 4124a or 4124b may be a space formed by cutting out a portion of the first bracket 412 in a direction (e.g., the x-axis direction) perpendicular to the hinge axis Ha or Hb. For example, with reference to FIG. 4G, the rotation space 4124a may be formed from the left side (e.g., the −x direction side) to the right side (e.g., the +x direction side) of the first bracket 412 such that the left side (e.g., the −x direction side) portion of the first bracket 412 is open, and the other rotation space 4124b may be formed from the right side (e.g., the +x direction side) to the left side (e.g., the −x direction side) of the first bracket 412 such that the right side (e.g., the +x direction side) portion of the first bracket 412 is open. The rotation space 4124a may be formed at a relatively lower side (e.g., the −y direction side) than the other rotation space 4124b.

In an example embodiment, the rotation rail 4121a or 4121b may protrude from surfaces (e.g., surfaces in the +y and −y directions), facing each other, of the rotation space 4124a or 4124b and may be formed in an arc shape. For example, the rotation rail 4121a may protrude from surfaces (e.g., surfaces in the +y and −y directions), facing each other, of the rotation space 4124a and may be formed in an arc shape and the other rotation rail 4121b may protrude from surfaces (e.g., surfaces in the +y and −y directions), facing each other, of the other rotation space, that is, the rotation space 4124b, and may be formed in an arc shape. However, this is an example, and the shape and/or location of the pair of rotation rails 4121a and 4121b and/or the pair of rotation spaces 4124a and 4124b are not limited thereto.

In an example embodiment, with reference to FIG. 4U, an arm rotating part (e.g., the arm rotating part 432 of FIG. 4J) of the pair of arms 430a and 430b, described below, may be configured to be inserted into the pair of arm axis insertion portions 4122a and 4122b. The pair of arm axis insertion portions 4122a and 4122b may be formed in the upper portion (e.g., the +y side portion) of the first bracket 412. For example, the pair of arm axis insertion portions 4122a and 4122b may be symmetrical with respect to the y-axis. The arm axis insertion portion 4122a or 4122b may include a space substantially corresponding to the arm rotating part 432. One side (e.g., the −z direction side) of the arm axis insertion portion 4122a or 4122b may be open. When the first bracket 412 connects to the main bracket 411, the arm axis pressurizer 4113a or 4113b may be positioned on the open side (e.g., the −z direction side) of the arm axis insertion portion 4122a or 4122b. A space into which the arm rotating part 432 is inserted may be formed between the arm axis insertion portion 4122a or 4122b and the arm axis pressurizer 4113a or 4113b. Both ends of the arm rotating part 432 may be accommodated in the space formed by the arm axis insertion portion 4122a or 4122b and the arm axis pressurizer 4113a or 4113b.

Referring to FIGS. 4A, 4B, 4C, 4D, 4E, 4F, and 4G, in an example embodiment, the second bracket 413 may be slidably connected to the main bracket 411. For example, the second bracket 413 may be slidably connected to the upper portion (e.g., the portion in the +y direction) of the main bracket 411 from the front surface side (e.g., the +z direction side) of the main bracket 411.

In an example embodiment, the second bracket 413 may include a pair of helical rails 4131a and 4131b and the pair of sliding rails 4132a and 4132b.

In an example embodiment, the pair of helical rails 4131a and 4131b may be configured to slidably connect a pair of second rotators 422a and 422b, described below, to the second bracket 413. The helical rail 4131a or 4131b may interoperate with a helical groove (e.g., a helical groove 4223 of FIG. 4H) of the second rotator 422a or 422b. The helical rail 4131a or 4131b may be formed in a helical shape with the hinge axis Ha or Hb as the center. A helical direction of the helical rail 4131a may be opposite to a helical direction of the other helical rail 4131b. For example, the helical shape of the helical rail 4131a may be in a counter-clockwise direction with respect to the hinge axis Ha and the helical shape of the other helical rail 4131b may be in a clockwise direction with respect to the hinge axis Hb.

In an example embodiment, the helical rail 4131a or 4131b may be formed in a helical space 4133a or 4133b, which is a cut-out portion of the second bracket 413. The helical space 4133a or 4133b may be a space formed by cutting out a portion of the second bracket 413 in a helical shape with the hinge axis Ha or Hb as the center. A helical direction of the helical space 4133a may be opposite to a helical direction of the helical space 4133b. For example, the helical space 4133a may include the helical shape in a counterclockwise direction with respect to the hinge axis Ha and the other helical space 4133b may include the helical shape in a clockwise direction with respect to the hinge axis Hb. The helical space 4133a may be formed at a relatively lower side (e.g., the −y direction side) than the other helical space 4133b.

In an example embodiment, the helical rail 4131a or 4131b may protrude from surfaces (e.g., surfaces in the +y and −y directions), facing each other, of the helical space 4133a or 4133b and may be formed in the helical shape. For example, the helical rail 4131a may protrude from surfaces (e.g., surfaces in the +y and −y directions), facing each other, of the helical space 4133a and may be formed in the helical shape and the other helical rail 4131b may protrude from surfaces (e.g., surfaces in the +y and −y directions), facing each other, of the other helical space 4133b and may be formed in the helical shape. However, this is an example, and the shape and/or location of the pair of helical rails 4131a and 4131b and/or the pair of helical spaces 4133a and 4133b are not limited thereto.

In an example embodiment, the pair of sliding rails 4132a and 4132b may be configured to slidably connect the second bracket 413 to the main bracket 411. The sliding rail 4132a or 4132b may interoperate with the sliding projection 4112a or 4112b of the main bracket 411. The sliding rail 4132a or 4132b may be formed in a longitudinal direction (e.g., the y direction) parallel with the hinge axis Ha or Hb.

In an example embodiment, the sliding rail 4132a or 4132b may be formed in a sliding space 4134a or 4134b, which is a cut-out portion of the second bracket 413. The sliding space 4134a or 4134b may be a space formed by cutting out a portion of the second bracket 413 in the longitudinal direction (e.g., the y direction) of the sliding space 4134a or 4134b parallel with the hinge axis Ha or Hb. For example, with reference to FIG. 4G, the sliding space 4134a may be formed on the left side (e.g., the −x direction side) of the second bracket 413 and the other sliding space 4134b may be formed on the right side (e.g., the +x direction side) of the second bracket 413. For example, the sliding space 4134a may be formed at a relatively upper side (e.g., the +y direction side) than the helical space 4133a and the other sliding space 4134b may be formed at a relatively lower side (e.g., the −y direction side) than the other helical space 4133b.

In an example embodiment, the sliding rail 4132a or 4132b may protrude by a designated width from a side surface (e.g., a surface in the −x direction or +x direction) of the sliding space 4134a or 4134b. For example, the sliding rail 4132a may protrude by a designated width in the left direction (e.g., the −x direction) from at least a portion of the right side surface (e.g., the surface in the +x direction) of the sliding space 4134a and the other sliding rail 4132b may protrude by a designated width in the right direction (e.g., the +x direction) from at least a portion of the left side surface (e.g., the surface in the −x direction) of the other sliding space 4134b. However, this is an example, and the shape and/or location of the pair of sliding rails 4132a and 4132b and/or the pair of sliding spaces 4134a and 4134b are not limited thereto.

In an example embodiment, the second bracket 413 may be slidably connected to the main bracket 411 through interoperation of the pair of sliding rails 4132a and 4132b with the pair of sliding projections 4112a and 4112b. The sliding projection 4112a or 4112b may be inserted into the sliding space 4134a or 4134b to be caught by the upper side (e.g., the +z direction side) of the sliding rail 4132a or 4132b of the second bracket 413. When the sliding projection 4112a or 4112b is caught by the upper side (e.g., the +z direction side) of the sliding rail 4132a or 4132b, the sliding rail 4132a or 4132b may relatively slide in the longitudinal direction (e.g., the y-axis direction) with respect to the sliding projection 4112a or 4112b. According to the structure described above, the second bracket 413 may slide by a designated length in the hinge axis Ha or Hb direction (e.g., the y-axis direction) with respect to the main bracket 411.

In addition, the description has been provided where the bracket structure 410 includes the main bracket 411, the first bracket 412, and the second bracket 413 and the main bracket 411, the first bracket 412, and the second bracket 413 are separate components. However, this is an example, and the main bracket 411 and the first bracket 412 may be integrally formed as one.

FIG. 4H is an exploded rear perspective view illustrating a pair of rotator structures according to an example embodiment. FIG. 4I is an exploded rear view illustrating the pair of rotator structures according to an example embodiment.

Referring to FIGS. 4A, 4B, 4C, 4D, 4E, 4F, 4G, 4H, and 4I, in an example embodiment, the pair of rotator structures 420a and 420b may be connected to the bracket structure 410 and respectively rotatable on the hinge axes Ha and Hb.

In an example embodiment, the rotator structure 420a or 420b may include the first rotator 421a or 421b, the second rotator 422a or 422b, and a bridge 423a or 423b. Hereinafter, for ease of description, the description is provided based on the rotator structure 420a to describe the pair of rotator structures 420a and 420b.

Referring to FIGS. 4A, 4B, 4C, 4D, 4E, 4F, 4G, 4H, and 4I, in an example embodiment, the first rotator 421a may be rotatably connected to the first bracket 412 with respect to the hinge axis Ha. For example, the first rotator 421a may be connected to the rotation rail 4121a of the first bracket 412.

In an example embodiment, the first rotator 421a may include a first rotator body 4211, a rotation protrusion 4212, a rotation groove 4213, and a first pin insertion portion 4214.

In an example embodiment, the first rotator body 4211 may be substantially formed in a plate shape. The first rotator body 4211 may be configured to be fixedly connected a first housing (e.g., the first housing 311 of FIG. 3). The first rotator body 4211 may be disposed in parallel with the front surface (e.g., the surface in the +z direction with reference to FIG. 3) of the first housing 311.

In an example embodiment, at least one housing connection hole 42111 for fixing the first rotator 421a to the first housing 311 may be formed in the first rotator body 4211. For example, the housing connection hole 42111 may be formed to penetrate the first rotator body 4211 in the z-axis direction. For example, a fastening member (e.g., a screw, a bolt, a pin, and/or a combination fastening structure) may be inserted into the housing connection hole 42111. Although two housing connection holes 42111 are formed, as shown in FIGS. 4H and 4I, this is an example, and the number, shape, and/or location of the housing connection holes 42111 is not limited thereto.

In an example embodiment, a first bridge connection hole 42112 and a first bridge alignment hole 42113 may be formed in the first rotator body 4211 for connecting to the bridge 423a, described below. The first bridge connection hole 42112 may be formed to penetrate one side of the first rotator body 4211 in the z-axis direction. For example, with reference to FIG. 4I, the first bridge connection hole 42112 may be formed in the right (e.g., the −x direction side) upper end (e.g., the end in the +y direction) of the first rotator body 4211. The first bridge alignment hole 42113 may be formed to penetrate the first rotator body 4211 in the z-axis direction at a position adjacent to the first bridge connection hole 42112. However, this is an example, and the number, shape, and/or location of the first bridge connection hole 42112 and/or the first bridge alignment hole 42113 is not limited thereto. A detailed description of the first bridge connection hole 42112 and the first bridge alignment hole 42113 is provided below.

In an example embodiment, the rotation protrusion 4212 may protrude from the rear surface (e.g., the surface in the −z direction) on one side of the first rotator body 4211. For example, with reference to FIG. 4I, the rotation protrusion 4212 may protrude from the rear surface (e.g., the surface in the −z direction) on the left side (e.g., the +x direction side) of the first rotator body 4211. The rotation protrusion 4212 may protrude in an arc shape with the hinge axis Ha as the center. The rotation protrusion 4212 may be inserted into the rotation space 4124a of the first bracket 412.

In an example embodiment, the rotation groove 4213 may be formed by recessing the rotation protrusion 4212. The rotation groove 4213 may include the first rotation groove 42131 and the second rotation groove 42132.

In an example embodiment, the first rotation groove 42131 may be formed in an arc shape with the hinge axis Ha as the center and may be recessed in both side surfaces (e.g., the surfaces in the +y and −y directions) of the rotation protrusion 4212. The first rotation groove 42131 may interoperate with the rotation rail 4121a of the first bracket 412. For example, the rotation rail 4121a of the first bracket 412 may be inserted into the first rotation groove 42131. The rotation rail 4121a may relatively rotate on the hinge axis Ha within a designated angle range along the arc shape of the first rotation groove 42131. According to the structure described above, the first rotator 421a may rotate on the hinge axis Ha with respect to the first bracket 412 within a designated angle range.

In an example embodiment, the second rotation groove 42132 may be formed by recessing the front surface (e.g., the surface in the +z direction) of the rotation protrusion 4212. For example, the second rotation groove 42132 may be formed by recessing in an arc shape with the hinge axis Ha as the center. The second rotation groove 42132 may interoperate with the rotation guide 4111a of the main bracket 411. For example, when the main bracket 411, the first bracket 412, and the first rotator 421a are connected to each other, the rotation guide 4111a of the main bracket 411 may be inserted into the second rotation groove 42132. While the first rotator 421a rotates on the hinge axis Ha with respect to the first bracket 412 within the designated angle range, the rotation guide 4111a of the main bracket 411 may relatively rotate along the second rotation groove 42132 and may guide a rotation path of the first rotator 421a.

In an example embodiment, the first pin insertion portion 4214 may be configured to insert a pin 440a therein. The first pin insertion portion 4214 may be formed in the upper end (e.g., the end in the +y direction) of the first rotator body 4211. The first pin insertion portion 4214 may be formed to penetrate the first rotator body 4211 in the y-axis direction.

In an example embodiment, to describe the first rotators 421a and 421b, the description is provided based on the first rotator 421a for ease of description, and the other first rotator 421b may be substantially formed symmetrical to the first rotator 421a. However, for efficient disposition, the rotation protrusion 4212 and the rotation groove 4213 may be alternately disposed. For example, the rotation protrusion 4212 and the rotation groove 4213 of the first rotator 421a may be formed on a relatively upper side (e.g., the +z direction side) than the rotation protrusion 4212 and the rotation groove 4213 of the other first rotator 421b.

Referring to FIGS. 4A, 4B, 4C, 4D, 4E, 4F, 4G, 4H, and 4I, in an example embodiment, the second rotator 422a may be rotatably connected to the second bracket 413 with respect to the hinge axis Ha. For example, the second rotator 422a may be connected to the helical rail 4131a of the second bracket 413.

In an example embodiment, the second rotator 422a may include a second rotator body 4221, a helical protrusion 4222, the helical groove 4223, and a second pin insertion portion 4224.

In an example embodiment, the second rotator body 4221 may be substantially formed in a plate shape. The second rotator body 4221 may be configured to be fixedly connected to a first housing (e.g., the first housing 311 of FIG. 3). The second rotator body 4221 may be disposed in parallel with the front surface (e.g., the surface in the +z direction with reference to FIG. 3) of the first housing 311.

In an example embodiment, at least one housing connection hole 42211 for fixing the second rotator 422a to the first housing 311 may be formed in the second rotator body 4221. For example, the housing connection hole 42211 may be formed to penetrate the second rotator body 4221 in the z-axis direction. For example, a fastening member (e.g., a screw, a bolt, a pin, and/or a combination fastening structure) may be inserted into the housing connection hole 42211. Although one housing connection hole 42211 is formed, as shown in FIGS. 4H and 4I, this is an example, and the number, shape, and/or location of the housing connection hole 42211 is not limited thereto.

In an example embodiment, a second bridge connection hole 42212 and a second bridge alignment hole 42213 may be formed in the second rotator body 4221 for connecting to the bridge 423a, described below. The second bridge connection hole 42212 may be formed to penetrate one side of the second rotator body 4221 in the z-axis direction. For example, the second bridge connection hole 42212 may be formed in the right (e.g., the −x direction side) lower end (e.g., the end in the −y direction) of the second rotator body 4221. The second bridge alignment hole 42213 may be formed to penetrate the second rotator body 4221 in the z-axis direction at a position adjacent to the second bridge connection hole 42212. However, this is an example, and the number, shape, and/or location of the second bridge connection hole 42212 and/or the second bridge alignment hole 42213 is not limited thereto. A detailed description of the second bridge connection hole 42212 and the second bridge alignment hole 42213 is provided below.

In an example embodiment, the helical protrusion 4222 may protrude from the rear surface (e.g., the surface in the −z direction) on one side of the second rotator body 4221. For example, the helical protrusion 4222 may protrude from the rear surface (e.g., the surface in the −z direction) on the left side (e.g., the +x direction side) of the second rotator body 4221. The helical protrusion 4222 may protrude in a helical shape with the hinge axis Ha as the center. The helical protrusion 4222 may be inserted into the helical space 4133a of the second bracket 413. The helical protrusion 4222 may be formed in a shape corresponding to the helical space 4133a.

In an example embodiment, the helical groove 4223 may be formed by recessing the helical protrusion 4222. The helical groove 4223 may be formed in a helical shape with the hinge axis Ha as the center and may be recessed in both side surfaces (e.g., the surfaces in the +y and −y directions) of the helical protrusion 4222. The helical groove 4223 may interoperate with the helical rail 4131a of the second bracket 413. For example, the helical rail 4131a of the second bracket 413 may be inserted into the helical groove 4223. The helical rail 4131a may relatively rotate with the hinge axis Ha as the center within a designated angle range along the helical shape of the helical groove 4223. According to the structure described above, the second rotator 422a may rotate on the hinge axis Ha with respect to the second bracket 413 within a designated angle range. A helical rotation operation of the second rotator 422a and the second bracket 413 is described below.

In an example embodiment, the second pin insertion portion 4224 may be configured to insert the pin 440a therein. The second pin insertion portion 4224 may be formed on a lower end (e.g., the end in the −y direction) of the second rotator body 4221. The second pin insertion portion 4224 may be formed to penetrate the second rotator body 4221 in the y-axis direction. A space 42214 that partially cuts the second rotator body 4221 may be formed in the lower direction (e.g., the −y direction) of the second pin insertion portion 4224 to dispose the elastic member 450a.

In an example embodiment, to describe the second rotators 422a and 422b, the description is provided based on the second rotator 422a for ease of description and the other second rotator 422b may be substantially formed symmetrical to the second rotator 422a. However, for efficient disposition, the helical protrusion 4222 and the helical groove 4223 may be alternately disposed. For example, the helical protrusion 4222 and the helical groove 4223 of the second rotator 422a may be formed on a relatively upper side (e.g., the +z direction side) than the helical protrusion 4222 and the helical groove 4223 of the second rotator 422b.

Referring to FIGS. 4A, 4B, 4C, 4D, 4E, 4F, 4G, 4H, and 4I, in an example embodiment, the bridge 423a may be configured to connect the first rotator 421a to the second rotator 422a. For example, the first rotator 421a may be connected to one side (e.g., the −y direction side) of the bridge 423a and the second rotator 422a may be connected to the other side (e.g. the +y direction side) of the bridge 423a.

In an example embodiment, the bridge 423a may include a bridge body 4231 and a pair of pin pressurizer 4232a and 4232b.

In an example embodiment, the bridge body 4231 may form the exterior of the bridge 423a. The bridge body 4231 may be formed to have a longitudinal direction in the y-axis direction. The bridge body 4231 may be formed in a shape in which a portion thereof is bent outward (e.g., the −x direction side). For example, a lower portion (e.g., the portion in the −y direction) of the bridge body 4231 may be relatively and outwardly (e.g., the −x direction side) bent and protrude compared to an upper portion (e.g., the portion in the +y direction) of the bridge body 4231.

In an example embodiment, a first bridge connection hole 42311 and a first bridge alignment pin 42312 may be formed in the bridge body 4231. The first bridge connection hole 42311 and the first bridge alignment pin 42312 may be formed in the lower portion (e.g., the portion in the −y direction) of the bridge body 4231. The first bridge connection hole 42311 and the first bridge alignment pin 42312 may be formed at locations corresponding to the first bridge connection hole 42112 and the first bridge alignment hole 42113, respectively. The first bridge connection hole 42311 may penetrate the bridge body 4231 in the z-axis direction. The first bridge alignment pin 42312 may protrude from the front surface (e.g., the surface in the +z direction) of the bridge body 4231. For example, when the first bridge alignment pin 42312 is inserted into the first bridge alignment hole 42113 of the first rotator 421a and the first bridge connection holes 42311 and 42112 communicate with each other, the bridge 423a may be connected to the first rotator 421a by an inserted fastening member (e.g., a screw, a bolt, a pin, and/or a combination fastening structure).

In an example embodiment, the second bridge connection hole 42313 and the second bridge alignment pin 42314 may be formed in the bridge body 4231. The second bridge connection hole 42313 and the second bridge alignment pin 42314 may be formed in the upper portion (e.g., the portion in the +y direction) of the bridge body 4231. The second bridge connection hole 42313 and the second bridge alignment pin 42314 may be formed at locations corresponding to the second bridge connection hole 42212 and the second bridge alignment hole 42213, respectively. The second bridge connection hole 42313 may penetrate the bridge body 4231 in the z-axis direction. The second bridge alignment pin 42314 may protrude from the front surface (e.g., the surface in the +z direction) of the bridge body 4231. For example, when the second bridge alignment pin 42314 is inserted into the second bridge alignment hole 42213 of the second rotator 422a and the second bridge connection holes 42313 and 42212 communicate with each other, the bridge 423a may be connected to the second rotator 422a by inserting an inserted fastening member (e.g., a screw, a bolt, a pin, and/or a combination fastening structure).

In an example embodiment, the pair of pin pressurizers 4232a and 4232b may be respectively formed at both ends (e.g., the ends in the −y and +y directions) of the bridge body 4231. The pin pressurizer 4232a may protrude in the +x-axis direction from the lower end (e.g., the end in the −y direction) of the bridge body 4231. The other pin pressurizer 4232b may protrude in the +x-axis direction from the upper end (e.g., the end in the +y direction) of the bridge body 4231. A detailed description of the pair of pin pressurizers 4232a and 4232b is provided below with reference to FIG. 4T.

In an example embodiment, to describe the bridges 423a and 423b, the description is provided based on the bridge 423a for ease of description and the other bridge 423b may be substantially symmetrical to the bridge 423a.

In addition, in an example embodiment, the description has been given in which the rotator structure 420a or 420b includes the first rotator 421a or 421b, the second rotator 422a or 422b, and the bridge 423a or 423b, and the first rotator 421a or 421b, the second rotator 422a or 422b, and the bridge 423a or 423b are separate components. However, this is an example, and two or more of the first rotator 421a or 421b, the second rotator 422a or 422b, and the bridge 423a or 423b may be integrally formed as one. For example, the first rotator 421a or 421b, the second rotator 422a or 422b, and the bridge 423a or 423b may be integrally formed as one.

FIG. 4J is a perspective view illustrating a pair of arms, a pair of pins, and a pair of elastic members according to an example embodiment. FIG. 4K is a front view illustrating the pair of arms, the pair of pins, and the pair of elastic members according to an example embodiment.

Referring to FIGS. 4A, 4B, 4C, 4D, 4E, 4J, and 4K, in an example embodiment, the pair of arms 430a and 430b may be rotatably connected to the bracket structure 410 respectively with the arm axis Aa and the arm axis Ab as the center. The arm 430a or 430b may be substantially between the first rotator 421a or 421b and the second rotator 422a or 422b. To describe the pair of arms 430a and 430b, hereinafter, the description is provided based on the arm 430a for ease of description. The other arm 430b may be substantially symmetrical to the arm 430a.

In an example embodiment, the arm 430a may include an arm body 431, the arm rotating part 432, a penetrating rail 433, and an arm cam 434.

In an example embodiment, the arm body 431 may have a longitudinal direction perpendicular to the hinge axis Ha (e.g., the x direction). The arm body 431 may be substantially between the first rotator 421a and the second rotator 422a.

In an example embodiment, the arm rotating part 432 may define the arm axis Aa, which is the rotation center of the arm 430a. The arm axis Aa may be parallel with the hinge axis Ha. The arm rotating part 432 may be formed on one end (e.g., the end in the +x direction) of the arm body 431. The arm rotating part 432 may include a cylindrical shape in the arm axis Aa direction. As the arm rotating part 432 is rotatably inserted into an arm axis insertion portion (e.g., the arm axis insertion portion 4122a of FIG. 4F) of the first bracket 412, the arm 430a may rotate on the arm axis Aa with respect to the first bracket 412. The arm 430a may rotate between the first rotator 421a and the second rotator 422a with the arm rotating part 432 as the center. In addition, the bridge 423a may be at the outer side (e.g., the −x direction side) of the arm 430a such that the bridge 423a does not interfere with the rotation path of the arm 430a.

In an example embodiment, the penetrating rail 433 may penetrate the arm body 431 in a direction (e.g., the y direction) parallel with the arm axis Aa. The penetrating rail 433 may be formed in a longitudinal direction (e.g., the x direction) perpendicular to the arm axis Aa. The penetrating rail 433 may be formed to have a designated height (e.g., the height in the z direction). For example, the penetrating rail 433 may be formed as a space substantially having a cuboid shape. However, this is an example, and the shape of the penetrating rail 433 is not limited thereto.

In an example embodiment, the arm cam 434 may protrude from one side surface (e.g., the surface in the +y direction) of the arm body 431. For example, the arm cam 434 may protrude in a direction toward the second rotator 422a. The arm cam 434 may be substantially formed at a position corresponding to a central portion of the penetrating rail 433 with respect to the longitudinal direction (e.g., the x direction) of the penetrating rail 433. The arm cam 434 may include a first inclined surface 4341, a first plane 4342, and a second inclined surface 4343. The first inclined surface 4341, the first plane 4342, and the second inclined surface 4343 may be disposed in the longitudinal direction (e.g., the x direction) of the penetrating rail 433. For example, the first inclined surface 4341, the first plane 4342, and the second inclined surface 4343 may be formed in this order from the +x direction to the −x direction. In an example embodiment, the arm cam 434 may include at least one curved surface. For example, the arm cam 434 may include a curved surface integrally formed as one by the first inclined surface 4341 and the second inclined surface 4343. The arm cam 434 may be configured to interoperate with a pin cam 442, described below.

Referring to FIGS. 4A, 4B, 4C, 4D, 4E, 4J, and 4K, in an example embodiment, the pair of pins 440a and 440b may be respectively connected to the rotator structures 420a and 420b by respectively passing through the penetrating rails 433 of the arms 430a and 430b. The pair of pins 440a and 440b may respectively rotate on pin axes Pa and Pb and may be respectively connected to the rotator structures 420a and 420b. For example, one end (e.g., the end in the −y direction) of the pin 440a or 440b may be rotatably inserted into the first pin insertion portion (e.g., the first pin insertion portion 4214 of FIG. 4H) of the first rotator 421a or 421b and the other end (e.g., the end in the +y direction) of the pin 440a or 440b may be rotatably inserted into the second pin insertion portion (e.g., the second pin insertion portion 4224 of FIG. 4H) of the second rotator 422a or 422b. To describe the pair of pins 440a and 440b, hereinafter, the description is provided based on the pin 440a for ease of description. The other pin 440b may be substantially symmetrical to the pin 440a.

In an example embodiment, the pin 440a may include a pin body 441, the pin cam 442, and a sliding guide 443.

In an example embodiment, the pin body 441 may define the pin axis Pa. The pin axis Pa may be parallel with the hinge axis Ha and/or the arm axis Aa. The pin body 441 may be formed in a pin axis Pa direction (e.g., the y direction). For example, the pin body 441 may include a cylindrical shape in the pin axis Pa direction (e.g., the y direction). One end (e.g., the end in the −y direction) of the pin body 441 may be rotatably inserted into the first pin insertion portion 4214 of the first rotator 421a and the other end (e.g., the end in the +y direction) of the of the pin body 441 may be rotatably inserted into the second pin insertion portion 4224 of the second rotator 422a.

In an example embodiment, the pin cam 442 may be configured to interoperate with the arm cam 434 of the arm 430a. When the pin 440a passes through the arm 430a, the pin cam 442 may contact the arm cam 434. The pin cam 442 may protrude in the pin axis Pa direction (e.g., the −y direction) from the central portion of the pin body 441 to have a greater diameter than the pin body 441. For example, the pin cam 442 may protrude in a direction toward the first rotator 421a. The pin cam 442 may include a third inclined surface 4421, a second plane 4422, and a fourth inclined surface 4423. For example, the third inclined surface 4421, the second plane 4422, and the fourth inclined surface 4423 may be formed in this order from the −x direction to the +x direction. In an example embodiment, the pin cam 442 may include at least one curved surface. For example, the pin cam 442 may include a curved surface integrally formed as one by the third inclined surface 4421 and the fourth inclined surface 4423. Interoperation of the pin cam 442 with the arm cam 434 is described below.

In an example embodiment, the sliding guide 443 may be inserted into the penetrating rail 433 of the arm 430a. The sliding guide 443 may protrude in a direction (e.g., the −y-axis direction) toward the first rotator 421a from the portion in which the pin cam 442 is formed. The sliding guide 443 may slide along the penetrating rail 433 by being inserted into the penetrating rail 433. The sliding guide 443 may be formed to have a height (e.g., the height in the z direction) corresponding to the height (e.g., the height in the z direction) of the penetrating rail 433. The sliding guide 443 may be formed to have a length (e.g., the length in the x direction) less than the length (e.g., the length in the x direction) of the penetrating rail 433. For example, the sliding guide 443 may be substantially formed in a cuboid shape.

Referring to FIGS. 4A, 4B, 4C, 4D, 4E, 4J, and 4K, the pair of elastic members 450a and 450b may be respectively connected to the pins 440a and 440b. The elastic member 450a or 450b may be inserted into one end (e.g., the end in the +y direction) of the pin body 441. For example, the elastic member 450a or 450b may be inserted on to one end (e.g., the end in the +y direction) of the pin body 441 between the second rotator 422a or 422b and the pin 440a or 440b. The elastic member 450a or 450b may generate an elastic force in the pin axis Pa or Pb direction. For example, the elastic member 450a or 450b may press the pin cam 442 toward the arm cam 434. The pin cam 442 and the arm cam 434 may closely contact each other by the elastic force of the elastic member 450a or 450b.

FIG. 4L is a perspective view illustrating an intermediate state of the hinge assembly according to an example embodiment. FIG. 4M is a perspective view illustrating a folded state of the hinge assembly according to an example embodiment. FIG. 4N is a front view illustrating an unfolded state and a folded state of the hinge assembly according to an example embodiment.

Referring to FIGS. 4A, 4L, 4M, and 4N, as the pair of rotator structures 420a and 420b respectively rotate on the hinge axes Ha and Hb with respect to the bracket structure 410, the hinge assembly 400 may be in an unfolded state (e.g., FIG. 4A) or a folded state (e.g., FIG. 4L).

In an example embodiment, the pair of helical rails (e.g., the helical rails 4131a and 4131b of FIG. 4F) of the second bracket 413 may interoperate with a helical groove (e.g., the helical groove 4223 of FIG. 4H) of the pair of rotator structures 420a and 420b. When the rotator structure 420a or 420b rotates on the hinge axis Ha or Hb, as the helical rail 4131a or 4131b slides along the helical shape of the helical groove 4223, the second bracket 413 may slide in the hinge axis Ha or Hb direction (e.g., the y direction) with respect to the main bracket 411 by a pitch in the axis direction (e.g., the y-axis direction) corresponding to a rotation angle of the helical shape. In an example embodiment, when the hinge assembly 400 switches from the unfolded state (e.g., the upper part of FIG. 4N) to the folded state (e.g., the lower part of FIG. 4N), the second bracket 413 may linearly move in the +y direction by a designated length L with respect to the main bracket 411.

In an example embodiment, according to the structure described above, rotation operations of the pair of rotator structures 420a and 420b may interoperate with each other as the second bracket 413 linearly moves as a medium. A rotation operation of any one (e.g., 420a or 420b) of the pair of rotator structures 420a and 420b may interoperate with a rotation operation of the other one (e.g., 420a or 420b) as the second bracket 413 linearly moves as a medium. Accordingly, rotation angles of the pair of rotator structures 420a and 420b may be synchronized with each other.

FIG. 4O is a view illustrating by overlapping side views of an unfolded state, an intermediate state, and a folded state of the hinge assembly according to an example embodiment.

Hereinafter, with reference to FIG. 4O, in a process of switching from an unfolded state of the hinge assembly 400 to a folded state of the hinge assembly 400, a process in which the pins 440a and 440b slide with respect to the arms 430a and 430b, respectively, is described.

In an example embodiment, when the rotator structure 420a or 420b rotates on the hinge axis Ha or Hb, the pin 440a or 440b connected to the rotator structure 420a or 420b may rotate on the hinge axis Ha or Hb with the rotator structure 420a or 420b. A rotation path of the pin 440a or 440b is illustrated as R1. In addition, since the pin 440a or 440b penetrates the arm 430a or 430b, the arm 430a or 430b may rotate on the arm axis Aa or Ab in response to rotation of the pin 440a or 440b. A rotation path of the arm 430a or 430b is illustrated as R2. Since the position of the hinge axis Ha or Hb is different from the position of the arm axis Aa or Ab, the rotation path R1 of the pin 440a or 440b may be different from the rotation path R2 of the arm 430a or 430b. For example, the hinge axis Ha or Hb may be positioned on a relatively upper side (e.g., the +z direction side) than the arm axis Aa or Ab and may be positioned relatively close to the center of the hinge assembly 400. According to the structure described above, due to the difference between the rotation path R1 of the pin 440a or 440b and the rotation path R2 of the arm 430a or 430b, the pin 440a or 440b may slide with respect to the arm 430a or 430b. For example, when the hinge assembly 400 is in the unfolded state, the pin 440a or 440b may be positioned on the inner side (e.g., the side close to the center of the hinge assembly 400) of the penetrating rail (e.g., the penetrating rail 433 of FIG. 4J), when the hinge assembly 400 is in the intermediate state, the pin 440a or 440b may be positioned on the central portion of the penetrating rail 433, and when the hinge assembly 400 is in the folded state, the pin 440a or 440b may be positioned on the outer side (e.g., the side distanced from the center of the hinge assembly 400) of the penetrating rail 433.

In addition, referring to FIG. 4O, at least a portion of the front surface (e.g., the surface in the +z direction based on the unfolded state) of the arm 430a or 430b may be inclinedly formed in a lower direction (e.g., the −z direction based on the unfolded state) toward the outer side (e.g., the side distanced from the center of the hinge assembly 400). According to the structure described above, when the arm 430a or 430b rotates on the arm axis Aa or Ab, at least a portion of the arm 430a or 430b may not protrude compared to the front surface (e.g., the surface in the +z direction based on the unfolded state) of the rotator structure 420a or 420b.

FIG. 4P is a partial rear view based on a rotator structure in an unfolded state of the hinge assembly according to an example embodiment. FIG. 4Q is a partial rear view based on a rotator structure in an intermediate state of the hinge assembly according to an example embodiment. FIG. 4R is a partial rear view based on a rotator structure in a folded state of the hinge assembly according to an example embodiment.

Hereinafter, with reference to FIGS. 4A, 4L, 4M, 4P, 4Q, and 4R, in a process of switching from the unfolded state of the hinge assembly 400 to the folded state of the hinge assembly 400, a process of interoperation between the pin cam 442 and the arm cam 434 is described. For ease of description, the description is provided based on the rotator structure 420a and the other rotator structure 420b may be equally understood.

In an example embodiment, when the rotator structure 420a rotates on the hinge axis Ha, the pin 440a may slide along the penetrating rail (e.g., the penetrating rail 433 of FIG. 4J) with respect to the arm 430a. When the pin 440a slides along the penetrating rail 433 with respect to the arm 430a, the pin cam 442 may ride over the arm cam 434. For example, the pin cam 442 may slide in a direction (e.g., the y direction) perpendicular to the longitudinal direction of the penetrating rail 433 by contacting the arm cam 434.

In an example embodiment, referring to FIG. 4P, when the hinge assembly 400 is in the unfolded state, the first inclined surface 4341 of the arm cam 434 may contact the third inclined surface 4421 of the pin cam 442. In the state described above, the pin cam 442 may be required to ride over the arm cam 434 and cross to the opposite side (e.g., the side in which the second inclined surface 4343 is formed) to slide the pin 440a in a direction (e.g., the −u direction) with respect to the arm 430a. In addition, the first inclined surface 4341 of the arm cam 434 may closely contact the third inclined surface 4421 of the pin cam 442 by an elastic force of the elastic member 450a. Accordingly, a force greater than the elastic force of the elastic member 450a may be required by the pin cam 442 to ride over the arm cam 434 and cross to the opposite side (e.g., the side in which the second inclined surface 4343 is formed). Accordingly, to fold the rotator structure 420a when the hinge assembly 400 is in the unfolded state, a force or torque greater than a predetermined magnitude may be required by the pin cam 442 to ride over the arm cam 434 and this may function as an open detent for maintaining the hinge assembly 400 to be in the unfolded state.

In an example embodiment, referring to FIG. 4Q, when the hinge assembly 400 is in the intermediate state, the first plane 4342 of the arm cam 434 may contact the second plane 4422 of the pin cam 442. The first plane 4342 of the arm cam 434 may closely contact the second plane 4422 of the pin cam 442 by the elastic force of the elastic member 450a. Since the elastic force of the elastic member 450a may function as a normal force between the first plane 4342 and the second plane 4422, a strong friction force may be generated between the first plane 4342 and the second plane 4422. Thus, a force greater than the friction force generated between the first plane 4342 and the second plane 4422 may be required by the pin cam 442 to cross to the one side (e.g., the −u direction side) or the other side (e.g., the +u direction side) of the arm cam 434. Accordingly, to fold or unfold the rotator structure 420a when the hinge assembly 400 is in the intermediate state, a force or torque greater than a predetermined magnitude may be required and this may function as a free stop force for maintaining the hinge assembly 400 to be in the intermediate state.

In an example embodiment, referring to FIG. 4R, when the hinge assembly 400 is in the folded state, the second inclined surface 4343 of the arm cam 434 may contact the fourth inclined surface 4423 of the pin cam 442. In the state described above, the pin cam 442 may be required to ride over the arm cam 434 and cross to the opposite side (e.g., the side in which the first inclined surface 4341 is formed) to slide the pin 440a in another direction (e.g., the +u direction) with respect to the arm 430a. In addition, the second inclined surface 4343 of the arm cam 434 may closely contact the fourth inclined surface 4423 of the pin cam 442 by the elastic force of the elastic member 450a. Accordingly, a force greater than the elastic force of the elastic member 450a may be required by the pin cam 442 to ride over the arm cam 434 and cross to the opposite side (e.g., the side in which the first inclined surface 4341 is formed). Accordingly, to unfold the rotator structure 420a when the hinge assembly 400 is in the folded state, a force or torque greater than a predetermined magnitude may be required by the pin cam 442 to ride over the arm cam 434 and this may function as a close detent for maintaining the hinge assembly 400 to be in the folded state.

FIG. 4S is a schematic view illustrating by overlapping side views of an unfolded state, an intermediate state, and a folded state of the hinge assembly according to an example embodiment.

Hereinafter, with reference to FIG. 4S, in a process of switching from the unfolded state of the hinge assembly 400 to the folded state of the hinge assembly 400, a process of rotating the pin 440b on the pin axis Pb such that the pin cam (e.g., the pin cam 442 of FIG. 4J) is parallel with the arm cam (e.g., the arm cam 434 of FIG. 4J) is described. For ease of description, the description is provided based on the rotator structure 420b and the other rotator structure 420a may be equally understood.

In an example embodiment, since the rotation path of the rotator structure 420b is different from the rotation path of the arm 430b, the rotator structure 420b may not be parallel with the arm 430b when the hinge assembly 400 operates. For example, when the hinge assembly 400 is in the unfolded state, the rotator structure 420b and the arm 430b may be parallel with each other (see H1 and A1 of FIG. 4S). However, while the hinge assembly 400 is folded, the rotator structure 420b and the arm 430b may not be parallel with each other (see H2, A2, H3, and A3 of FIG. 4S). In addition, although the pin 440b is configured to rotate with the rotator structure 420b, the pin 440b may rotate on the pin axis Pb with respect to the rotator structure 420a. Accordingly, while the hinge assembly 400 operates, the pin 440b may rotate (e.g., revolve) on the hinge axis Hb while simultaneously rotating (e.g., rotation) on the pin axis Pa. The rotation of the pin 440b on the pin axis Pb may be induced by restriction by the sliding guide 443 and the penetrating rail 433. For example, the sliding guide 443 may only move in the longitudinal direction of the penetrating rail 433 and may be constrained in the penetrating rail 433 such that the sliding guide 443 does not relatively rotate with respect to the penetrating rail 433. According to the structure described above, while the hinge assembly 400 is unfolded or folded, since the sliding guide 443 may only slide with respect to the penetrating rail 433 and is constrained to not to relatively rotate, the pin 440b may rotate on the pin axis Pb by an angle that may cause the sliding guide 443 to be parallel with the penetrating rail 433. Accordingly, while the hinge assembly 400 is unfolded or folded, as the pin 440b rotates on the pin axis Pa, the pin cam 442 may be maintained to be parallel with the arm cam 434. Thus, while the hinge assembly 400 is unfolded or folded, uneven wear caused by strong contact between some parts may decrease since the pin cam 442 and arm cam 434 and the sliding guide 443 and the penetrating rail 433 are not parallel with each other.

FIG. 4T is a cross-sectional view taken along line A-A of FIG. 4D.

Referring to FIGS. 4A, 4B, 4C, 4D, 4E, 4H, 4I, and 4T, in an example embodiment, when the rotator structure 420a or 420b is coupled to the pin 440a or 440b, the pair of pin pressurizers 4232a and 4232b may respectively cover one end (e.g., the end in the −y direction) and the other end (e.g., the end in the +y direction) of the pin 440a or 440b. For example, the pin pressurizer 4232a may be configured to cover one end (e.g., the end in the −y direction) of the pin 440a or 440b that passes through the first pin insertion portion 4214 and the other pin pressurizer 4232b may be configured to cover the other end (e.g., the end in the +y direction) of the pin 440a or 440b that passes through the second pin insertion portion 4224. For example, the pair of pin pressurizers 4232a and 4232b may be configured to cover one end (e.g., the end in the −y direction) and the other end (e.g., the end in the +y direction) of the pin 440a or 440b from the −z direction. In addition, the bridge 423a or 423b may be formed of a material that has its own elastic force. For example, the pair of pin pressurizers 4232a and 4232b may be formed of a material that has its own elastic force. Accordingly, by the elastic force of the pair of pin pressurizers 4232a and 4232b, the pair of pin pressurizers 4232a and 4232b may respectively press the end (e.g., the end in the −y direction) and the other end (e.g., the end in the +y direction) of the pin 440a or 440b in a direction (e.g., the +z direction) perpendicular to the pin axis Pa or Pb. According to the structure described above, despite a gap between the pin 440a or 440b, the first pin insertion portion 4214, the second pin insertion portion 4224 and the penetrating rail (e.g., the penetrating rail 433 of FIG. 4J), the position of the pin 440a or 440b may be aligned with the first pin insertion portion 4214, the second pin insertion portion 4224, and the penetrating rail 433 on one side (e.g., the +z direction side). Thus, although a direction of force rapidly changes during a process of interoperation between the arm cam (e.g., the arm cam 434 of FIG. 4J) and the pin cam (e.g., the pin cam 442 of FIG. 4J), since the position of the pin 440a or 440b in the first pin insertion portion 4214, the second pin insertion portion 4224, and the penetrating rail 433 is maintained to be aligned on one side (e.g., the +z direction side), a driving sound that may occur during the process of interoperation between the arm cam 434 and the pin cam 442 may decrease.

FIG. 4U is a cross-sectional view taken along line B-B of FIG. 4D.

Referring to FIGS. 4A, 4B, 4C, 4D, 4E, 4F, 4G and 4U, in an example embodiment, the arm rotating part 432 may be positioned in a space formed by the arm axis insertion portion 4122a or 4122b of the first bracket 412 and the arm axis pressurizer 4113a or 4113b of the main bracket 411. For example, when one side (e.g., the −z direction side) of the arm axis insertion portion 4122a or 4122b is open and the arm rotating part 432 is inserted into the arm axis insertion portion 4122a or 4122b, the arm axis pressurizer 4113a or 4113b may be positioned on the open side (e.g., the −z direction side) of the arm axis insertion portion 4122a or 4122b. In addition, the first bracket 412 may be formed of a material that has its own elastic force. For example, the arm axis pressurizer 4113a or 4113b may be formed of a material that has its own elastic force. The arm axis pressurizer 4113a or 4113b may press the arm rotating part 432 in a direction (e.g., the +z direction) perpendicular to the arm axis Aa or Ab by its own elastic force. According to the structure described above, since the position of the arm rotating part 432 may be aligned on one side (e.g., the +z direction side) with the arm axis insertion portion 4122a or 4122b, the arm 430a or 430b may have reduced movement while the arm 430a or 430b rotates. Therefore, a driving sound that may occur as the arm 430a or 430b shakes when the hinge assembly 400 is unfolded or folded may decrease.

In an example embodiment, the electronic device 300 may include the display 250 including the first area 251, the second area 252, and the folding area 253 between the first area 251 and the second area 252; the first housing 311 configured to support the first area 251; the second housing 312 configured to support the second area 252; and the hinge assembly 400 configured to connect the first housing 311 to the second housing 312 and operate between a folded state in which the first area 251 and the second area 252 face each other and an unfolded state in which the first area 251 and the second area 252 do not face each other, wherein the hinge assembly 400 may include the bracket structure 410; the pair of rotator structures 420a and 420b connected to the bracket structure 410 and respectively rotatable on the pair of hinge axes Ha and Hb; the pair of arms 430a and 430b connected to the bracket structure 410, respectively rotatable on the pair of arm axes Aa and Ab, and each including an arm cam 434 and a penetrating rail 433 having a longitudinal direction perpendicular to the arm axis of the arm; the pair of pins 440a and 440b respectively passing through the penetrating rails 433, connected to the rotator structure 420a or 420b, respectively rotatable on the pair of pin axes Pa and Pb, and each including the pin cam 442 interoperating with the arm cam 434 and the sliding guide 443 slidable along the penetrating rail 433; and the pair of elastic members 450a and 450b respectively connected to the pair of pins 440a and 440b and each configured to press the pin cam 442 toward the arm cam 434, and wherein, when the rotator structure 420a or 420b rotates on the hinge axis Ha or Hb, the arm 430a or 430b rotates on the arm axis Aa or Ab, and the pin 440a or 440b rotates on the pin axis Pa or Pb while the pin 440a or 440b slides along the penetrating rail 433 with respect to the arm 430a or 430b.

In an example embodiment, the pin 440a or 440b may rotate on the pin axis Pa or Pb such that the sliding guide 443 is parallel with the penetrating rail 433.

In an example embodiment, the sliding guide 443 may move in the longitudinal direction of the penetrating rail 433 and may be constrained in the penetrating rail 433 such that the sliding guide 443 does not relatively rotate with respect to the penetrating rail 433.

In an example embodiment, the pin cam 442 may ride over the arm cam 434 while the pin 440a or 440b slides along the penetrating rail 433 with respect to the arm 430a or 430b.

In an example embodiment, the bracket structure 410 may include the main bracket 411; the first bracket 412 fixedly connected to the main bracket 411 and including the pair of rotation rails 4121a and 4121b respectively defining the pair of hinge axes Ha and Hb; and the second bracket 413 slidably connected to the main bracket 411 and including the pair of helical rails 4131a and 4131b with the pair of hinge axes Ha and Hb as centers, respectively.

In an example embodiment, each of the rotator structures 420a and 420b may include the first rotator 421a or 421b connected to the rotation rail 4121a or 4121b of the first bracket 412; and the second rotator 422a or 422b connected to the helical rail 4131a or 4131b of the second bracket 413.

In an example embodiment, the first rotator 421a or 421b may include the first pin insertion portion 4214 into which one end of the pin 440a or 440b is inserted, the second rotator 422a or 422b may include the second pin insertion portion 4224 into which the other end of the pin 440a or 440b is inserted, and the pin 440a or 440b may be rotatably inserted into the first pin insertion portion 4214 and the second pin insertion portion 4224.

In an example embodiment, each of the rotator structures 420a and 420b may further include the bridge 423a or 423b configured to connect the first rotator 421a or 421b to the second rotator 422a or 422b.

In an example embodiment, the bridge 423a or 423b may include the pair of pin pressurizers 4232 each configured to press one end and the other end of the pin 440a or 440b in a direction perpendicular to the pin axis Pa or Pb.

In an example embodiment, the first rotator 421a or 421b, the second rotator 422a or 422b and the bridge 423a or 423b are integrally formed as one.

In an example embodiment, the arm 430a or 430b may be between the first rotator 421a or 421b and the second rotator 422a or 422b.

In an example embodiment, each of the arms 430a and 430b may further include the arm rotating part 432 defining the respective arm axes Aa and Ab, and the first bracket 412 may further include the pair of arm axis insertion portions 4122a and 4122b into which the arm rotating parts 432 are respectively inserted.

In an example embodiment, the main bracket 411 may include the pair of arm axis pressurizers 4113a and 4113b each configured to press the arm rotating parts 432 in a direction perpendicular to the respective arm axes Aa and Ab.

In an example embodiment, one side of the arm axis insertion portion 4122a or 4122b may be open, and the arm axis pressurizer 4113a or 4113b may be on the open side of the arm axis insertion portion 4122a or 4122b to form a space, into which the arm rotating part 432 is inserted, between the arm axis insertion portion 4122a or 4122b and the arm axis pressurizer 4113a or 4113b.

In an example embodiment, the main bracket 411 and the first bracket 412 may be integrally formed as one.

In an example embodiment, the hinge assembly 400 applied to the foldable electronic device 300, the hinge assembly 400 may include the bracket structure 410; the pair of rotator structures 420a and 420b connected to the bracket structure 410 and respectively rotatable on the pair of hinge axes Ha and Hb; the pair of arms 430a and 430b connected to the bracket structure 410, respectively rotatable on the pair of arm axes Aa and Ab, and each including the arm cam 434 and the penetrating rail 433 having a longitudinal direction perpendicular to the arm axis Aa or Ab; the pair of pins 440a and 440b respectively passing through the penetrating rails 433, connected to the rotator structure 420a or 420b, respectively rotatable on the pair of pin axes Pa and Pb, and each including the pin cam 442 interoperating with the arm cam 434 and the sliding guide 443 slidable along the penetrating rail 433; and the pair of elastic members 450a and 450b respectively connected to the pair of pins 440a and 440b and each configured to press the pin cam 442 toward the arm cam 434, and wherein, when the rotator structure 420a or 420b rotates on the hinge axis Ha or Hb, the arm 430a or 430b rotates on the arm axis Aa or Ab, and the pin 440a or 440b rotates on the pin axis Pa or Pb while the pin 440a or 440b slides along the penetrating rail 433 with respect to the arm 430a or 430b.

In an example embodiment, the pin 440a or 440b may rotate on the pin axis Pa or Pb such that the sliding guide 443 is parallel with the penetrating rail 433.

In an example embodiment, the bracket structure 410 may include the main bracket 411; the first bracket 412 fixedly connected to the main bracket 411 and including the pair of rotation rails 4121a and 4121b respectively defining the pair of hinge axes Ha and Hb; and the second bracket 413 slidably connected to the main bracket 411 and including the pair of helical rails 4131a and 4131b with the pair of hinge axes Ha and Hb as centers, respectively.

In an example embodiment, each of the rotator structures 420a and 420b may include the first rotator 421a or 421b connected to the rotation rail 4121a or 4121b of the first bracket 412; the second rotator 422a or 422b connected to the helical rail 4131a or 4131b of the second bracket 413; and the bridge 423a or 423b configured to connect the first rotator 421a or 421b to the second rotator 422a or 422b.

In an example embodiment, the electronic device 300 may include the display 250 including the first area 251, the second area 252, and the folding area 253 between the first area 251 and the second area 252; the first housing 311 configured to support the first area 251; the second housing 312 configured to support the second area 252; and the hinge assembly 400 configured to connect the first housing 311 to the second housing 312 and operate between a folded state in which the first area 251 and the second area 252 face each other and an unfolded state in which the first area 251 and the second area 252 do not face each other, wherein the hinge assembly 400 may include the bracket structure 410; the pair of rotator structures 420a and 420b connected to the bracket structure 410 and respectively rotatable on the pair of hinge axes Ha and Hb; the pair of arms 430a and 430b connected to the bracket structure 410, respectively rotatable on the pair of arm axes Aa and Ab, and each including an arm cam 434 and a penetrating rail 433 having a longitudinal direction perpendicular to the arm axis of the arm; the pair of pins 440a and 440b respectively passing through the penetrating rails 433, connected to the rotator structure 420a or 420b, respectively rotatable on the pair of pin axes Pa and Pb, and each including the pin cam 442 interoperating with the arm cam 434 and the sliding guide 443 slidable along the penetrating rail 433; and the pair of elastic members 450a and 450b respectively connected to the pair of pins 440a and 440b and each configured to press the pin cam 442 toward the arm cam 434, the bracket structure 410 may include the main bracket 411; the first bracket 412 fixedly connected to the main bracket 411 and including the pair of rotation rails 4121a and 4121b respectively defining the pair of hinge axes Ha and Hb; and the second bracket 413 slidably connected to the main bracket 411 and including the pair of helical rails 4131a and 4131b with the pair of hinge axes Ha and Hb as centers, respectively, and each of the rotator structures 420a and 420b may further include the bridge 423a or 423b configured to connect the first rotator 421a or 421b to the second rotator 422a or 422b, and the arm 430a or 430b may be between the first rotator 421a or 421b and the second rotator 422a or 422b, and when the rotator structure 420a or 420b rotates on the hinge axis Ha or Hb, the arm 430a or 430b may rotate on the arm axis Aa or Ab, and the pin 440a or 440b may rotate on the pin axis Pa or Pb while sliding along the penetrating rail 433 with respect to the arm 430a or 430b such that the sliding guide 443 is parallel with the penetrating rail 433.

The embodiments of the disclosure disclosed in the specification and drawings are merely provided for specific examples in order to easily explain the technical contents according to the embodiments of the disclosure and help the understanding of the embodiments of the disclosure, and are not intended to limit the scope of the embodiments of the disclosure. Accordingly, the scope of various embodiments of the disclosure should be construed that all changes or modifications derived based on the technical spirit of various embodiments of the disclosure are included in the scope of various embodiments of the disclosure in addition to the embodiments disclosed herein.

What is claimed is:

1. An electronic device comprising: a display comprising a first area, a second area, and a folding area between the first area and the second area; a first housing configured to support the first area; a second housing configured to support the second area; and a hinge assembly configured to connect the first housing to the second housing and operate between a folded state in which the first area and the second area face each other and an unfolded state in which the first area and the second area do not face each other, wherein the hinge assembly comprises: a bracket structure; a pair of rotator structures connected to the bracket structure and respectively rotatable on a pair of hinge axes; a pair of arms connected to the bracket structure, respectively rotatable on a pair of arm axes, and each comprising an arm cam and a penetrating rail formed in the arm along a longitudinal direction perpendicular to the arm axis of the arm; a pair of pins respectively passing through the penetrating rails, connected to the rotator structure, respectively rotatable on a pair of pin axes, and each comprising a pin cam interoperating with the arm cam and a sliding guide slidable along a corresponding the penetrating rail; and a pair of elastic members respectively connected to the pair of pins and each configured to press the pin cam toward the arm cam, and wherein, as the arms rotate when the electronic device is folded and unfolded, the sliding guides of the respective pins slide in the corresponding penetrating rail along the longitudinal direction and the pin cams of the respective pins ride over the corresponding arm cams.

2. The electronic device of claim 1, wherein each pin is configured to rotate on the corresponding pin axis such that the corresponding sliding guide moves parallel to the longitudinal direction of the penetrating rail as the arms rotate.

3. The electronic device of claim 2, wherein each sliding guide is configured to slide in the longitudinal direction of the corresponding penetrating rail and is constrained in the corresponding penetrating rail such that the sliding guide does not relatively rotate with respect to the corresponding penetrating rail as the arms rotate.

4. The electronic device of claim 1, wherein the bracket structure comprises:
a main bracket;
a first bracket fixedly connected to the main bracket and comprising a pair of rotation rails respectively defining the pair of hinge axes; and
a second bracket slidably connected to the main bracket and comprising a pair of helical rails with the pair of hinge axes as centers, respectively.

5. The electronic device of claim 4, wherein each of the rotator structures comprises:
a first rotator connected to a corresponding rotation rail of the first bracket; and
a second rotator connected to a corresponding helical rail of the second bracket.

6. The electronic device of claim 5, wherein the first rotator comprises a first pin insertion portion into which one end of a corresponding pin is inserted,
the second rotator comprises a second pin insertion portion into which the other end of the corresponding pin is inserted, and
the corresponding pin is rotatably inserted into the first pin insertion portion and the second pin insertion portion.

7. The electronic device of claim 6, wherein each of the rotator structures further comprises a bridge configured to connect the first rotator to the second rotator.

8. The electronic device of claim 7, wherein the bridge comprises a pair of pin pressurizers each configured to press one end and the other end of the corresponding pin in a direction perpendicular to the pin axis of the corresponding pin.

9. The electronic device of claim 7, wherein the first rotator, the second rotator and the bridge are integrally formed.

10. The electronic device of claim 5, wherein a corresponding one of the arms is between the first rotator and the second rotator.

11. The electronic device of claim 4, wherein each of the arms further comprises an arm rotating part defining the respective arm axes, and
the first bracket further comprises a pair of arm axis insertion portions into which the arm rotating parts are respectively inserted.

12. The electronic device of claim 11, wherein the main bracket comprises a pair of arm axis pressurizers each configured to press the arm rotating parts in a direction perpendicular to the respective arm axes.

13. The electronic device of claim 12, wherein
one side of the arm axis insertion portion is open, and
the arm axis pressurizer is on the open side of the arm axis insertion portion to form a space, into which the arm rotating part is inserted, between the arm axis insertion portion and the arm axis pressurizer.

14. The electronic device of claim 4, wherein the main bracket and the first bracket are integrally formed.

15. A hinge assembly for a foldable electronic device, the hinge assembly comprising: a bracket structure; a pair of rotator structures connected to the bracket structure and respectively rotatable on a pair of hinge axes; a pair of arms connected to the bracket structure, respectively rotatable on a pair of arm axes, and each comprising an arm cam and a penetrating rail formed in the arm along a longitudinal direction perpendicular to the arm axis; a pair of pins respectively passing through the penetrating rails, connected to the rotator structure, respectively rotatable on a pair of pin axes, and each comprising a pin cam interoperating with the arm cam and a sliding guide slidable along a corresponding penetrating rail; and a pair of elastic members respectively connected to the pair of pins and each configured to press the pin cam toward the arm cam, and wherein, as the arms rotate, the sliding guides of the respective pins slide in the corresponding penetrating rail along the longitudinal direction and the pin cams of the respective pins ride over the corresponding arm cams.

16. The hinge assembly of claim 15, wherein each pin is configured to rotate on the corresponding pin axis such that the corresponding sliding guide moves parallel to the longitudinal direction of the penetrating rail as the arms rotate.

17. The hinge assembly of claim 15, wherein the bracket structure comprises:
a main bracket;
a first bracket fixedly connected to the main bracket and comprising a pair of rotation rails respectively defining the pair of hinge axes; and
a second bracket slidably connected to the main bracket and comprising a pair of helical rails with the pair of hinge axes as centers, respectively.

18. The hinge assembly of claim 17, wherein each of the rotator structures comprises:
a first rotator connected to a corresponding rotation rail of the first bracket;
a second rotator connected to a corresponding helical rail of the second bracket; and
a bridge configured to connect the first rotator to the second rotator.

19. An electronic device comprising: a display comprising a first area, a second area, and a folding area between the first area and the second area; a first housing configured to support the first area; a second housing configured to support the second area; and a hinge assembly configured to connect the first housing to the second housing and operate between a folded state in which the first area and the second area face each other and an unfolded state in which the first area and the second area do not face each other, wherein the hinge assembly comprises: a bracket structure; a pair of rotator structures connected to the bracket structure and respectively rotatable on a pair of hinge axes; a pair of arms connected to the bracket structure, respectively rotatable on a pair of arm axes, and each comprising an arm cam and a penetrating rail formed in the arm along a longitudinal direction perpendicular to the arm axis; a pair of pins respectively passing through the penetrating rails, connected to the rotator structure, respectively rotatable on a pair of pin axes, and each comprising a pin cam interoperating with the arm cam and a sliding guide slidable along a corresponding the penetrating rail; and a pair of elastic members respectively connected to the pair of pins and each configured to press the pin cam toward the arm cam, wherein the bracket structure comprises: a main bracket; a first bracket fixedly connected to the main bracket and comprising a pair of rotation rails respectively defining the pair of hinge axes; and a second bracket slidably connected to the main bracket and comprising a pair of helical rails with the pair of hinge axes as centers, respectively, wherein each of the rotator structures comprises: a first rotator connected to a corresponding the rotation rail of the first bracket; a second rotator connected to a corresponding the helical rail of the second bracket; and a bridge configured to connect the first rotator to the second rotator, wherein the arm is disposed between the first rotator and the second rotator, and wherein, as the arms rotate, the respective pins rotate on the corresponding pin axis so that the sliding guides of the respective pins remain parallel to the longitudinal direction of the corresponding penetrating rail as the respective sliding guide slides in the corresponding penetrating rail.

\* \* \* \* \*